(12) United States Patent
Ogawa

(10) Patent No.: US 10,768,126 B2
(45) Date of Patent: Sep. 8, 2020

(54) MULTIPLE CHARGED PARTICLE BEAM INSPECTION APPARATUS AND MULTIPLE CHARGED PARTICLE BEAM INSPECTION METHOD

(71) Applicant: NuFlare Technology, Inc., Yokohama-shi (JP)

(72) Inventor: Riki Ogawa, Kawasaki (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 16/419,598

(22) Filed: May 22, 2019

(65) Prior Publication Data
US 2019/0360951 A1 Nov. 28, 2019

(30) Foreign Application Priority Data
May 22, 2018 (JP) ................. 2018-098297

(51) Int. Cl.
*G01N 23/04* (2018.01)
*G01N 23/2251* (2018.01)
(Continued)

(52) U.S. Cl.
CPC ......... *G01N 23/2251* (2013.01); *G01N 23/04* (2013.01); *H01J 37/141* (2013.01);
(Continued)

(58) Field of Classification Search
CPC ......... G21F 7/005; G21F 5/015; B65B 3/006; G21G 1/0005
(Continued)

(56) References Cited

U.S. PATENT DOCUMENTS 4,818,873 A * 4/1989 Herriot ............... H01J 37/28
250/252.1
6,661,007 B1 * 12/2003 Sicignano ............ H01J 37/28
250/307

(Continued)

FOREIGN PATENT DOCUMENTS

JP 2003-202661 7/2003
JP 2018-017571 2/2018

*Primary Examiner* — Michael Maskell
(74) *Attorney, Agent, or Firm* — Oblon, McClelland, Maier & Neustadt, L.L.P.

(57) ABSTRACT

A multi-charged particle beam inspection apparatus includes a movable stage to place thereon an inspection substrate where plural dies each with the same pattern are arranged in a predetermined direction, a pitch acquisition circuit to acquire an arrangement pitch of plural dies, a magnification control circuit to control, when imaging the inspection substrate with multi-charged particle beams while continuously moving the stage, magnification of the multi-charged particle beams to be a controlled magnification such that the arrangement pitch of the plural dies becomes a natural number (2 or greater) multiple of an imaging region cycle in the predetermined direction of plural imaging regions to be individually imaged by each beam at each arrangement position of the multi-charged particle beams, and an acquisition mechanism to acquire inspection images of the plural dies on the inspection substrate, using the multi-charged particle beams whose magnification has been controlled to be the controlled magnification.

10 Claims, 14 Drawing Sheets

(51) Int. Cl.
*H01J 37/147* (2006.01)
*H01J 37/22* (2006.01)
*H01J 37/141* (2006.01)

(52) U.S. Cl.
CPC .......... *H01J 37/1474* (2013.01); *H01J 37/22* (2013.01); *G01N 2223/3301* (2013.01); *G01N 2223/6116* (2013.01); *H01J 2237/31798* (2013.01)

(58) Field of Classification Search
USPC ........... 250/306, 307, 310, 311, 492.1–492.3
See application file for complete search history.

(56) References Cited

U.S. PATENT DOCUMENTS

2003/0132382 A1    7/2003   Sogard
2018/0031498 A1*   2/2018   Shiratsuchi ............. H01J 37/22

\* cited by examiner

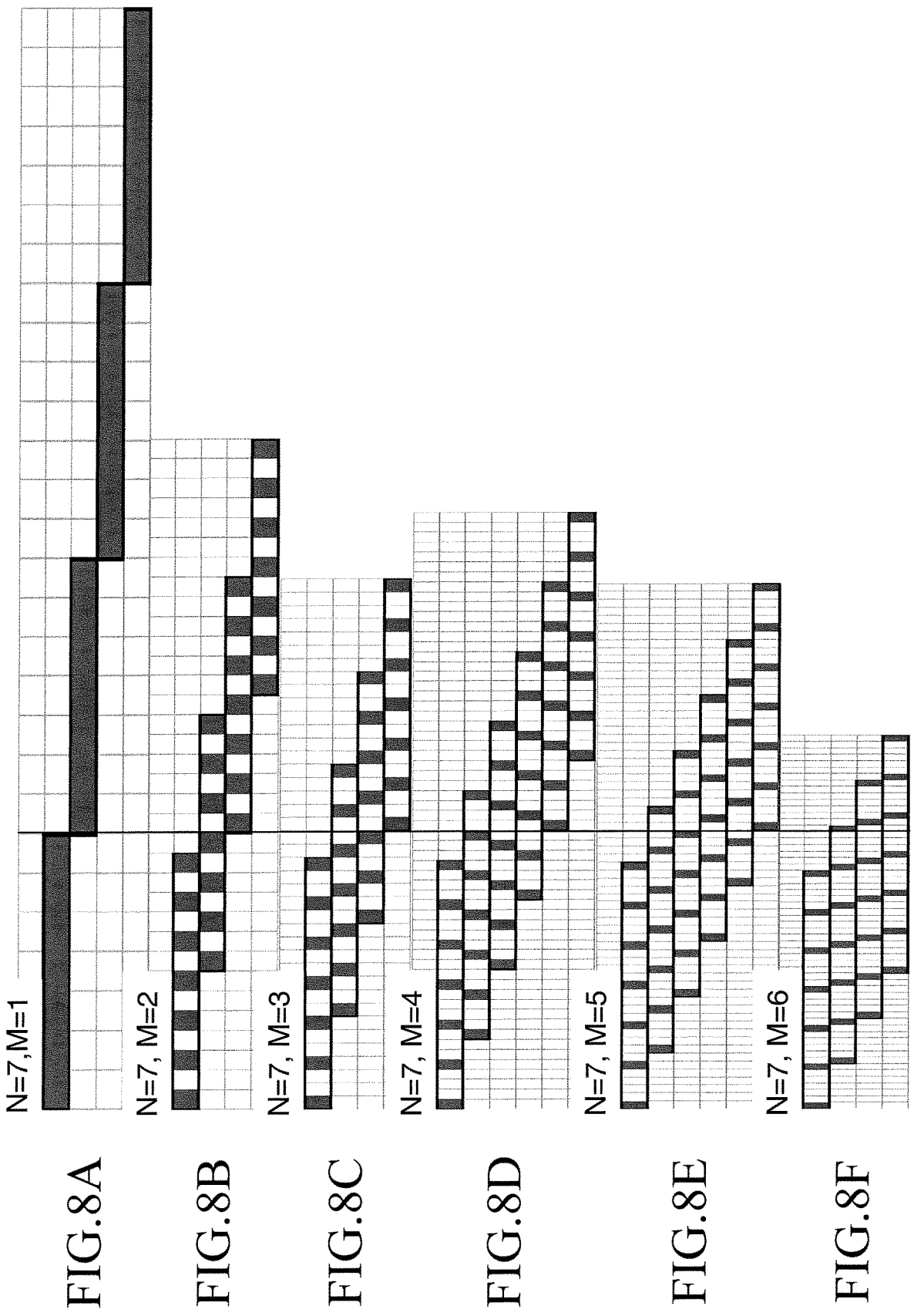

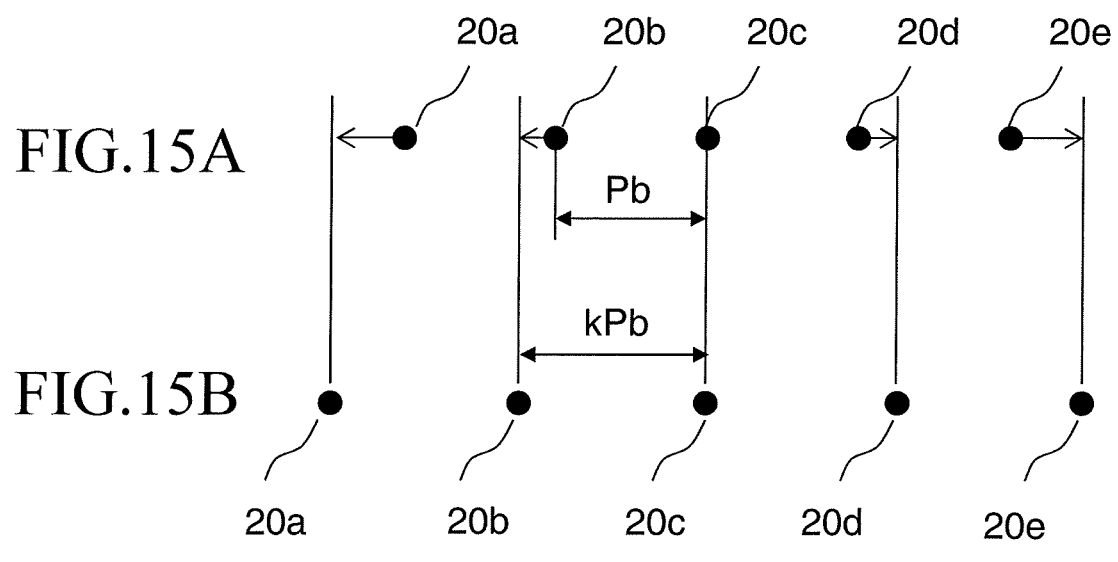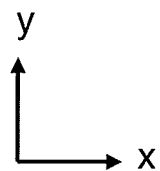

MULTIPLE CHARGED PARTICLE BEAM INSPECTION APPARATUS AND MULTIPLE CHARGED PARTICLE BEAM INSPECTION METHOD

CROSS-REFERENCE TO RELATED APPLICATION

This application is based upon and claims the benefit of priority from prior Japanese Patent Application No. 2018-098297 filed on May 22, 2018 in Japan, the entire contents of which are incorporated herein by reference.

BACKGROUND OF THE INVENTION

Field of the Invention

Embodiments of the present invention relate to a multiple charged particle beam inspection apparatus and a multiple charged particle beam inspection method. For example, embodiments of the present invention relate to a method for inspecting an inspection target substrate by the die-to-die method, using multiple electron beams.

Description of Related Art

In recent years, with the advance of high integration and large capacity of LSI (Large Scale Integration or Integrated circuits), the line width (critical dimension) required for circuits of semiconductor elements is becoming increasingly narrower. Since LSI manufacturing requires a tremendous amount of manufacturing cost, it is crucially essential to improve its yield. However, as typified by a 1-gigabit DRAM (Dynamic Random Access Memory), the scale of patterns which configure the LSI now has become on the order of nanometers from submicrons. Also, in recent years, with miniaturization of LSI patterns formed on a semiconductor wafer, dimensions of a pattern defect needed to be detected have become extremely small. Therefore, the pattern inspection apparatus for inspecting defects of ultrafine patterns exposed (transferred) on the semiconductor wafer needs to be highly accurate. Further, one of major factors that decrease the yield of the LSI manufacturing is due to pattern defects on the mask used for exposing (transferring) an ultrafine pattern onto a semiconductor wafer by the photolithography technology. Therefore, the pattern inspection apparatus for inspecting defects on a transfer mask used in manufacturing LSI needs to be highly accurate.

As an inspection method, there is known a method of comparing a measured image captured by imaging a pattern formed on the substrate, such as a semiconductor wafer and a lithography mask, with design data or with another measured image captured by imaging an identical pattern on the substrate. For example, the methods described below are known as pattern inspection, "die-to-die inspection" and "die-to-database inspection": the "die-to-die inspection" method compares data of measured images captured by imaging identical patterns at different positions on the same substrate; and the "die-to-database inspection" method generates design image data (reference image), based on pattern design data, to be compared with a measured image serving as measured data captured by imaging a pattern. Then, obtained captured images are transmitted as measured data to the comparison circuit. After providing alignment between images, the comparison circuit compares the measured data with the reference data in accordance with an appropriate algorithm, and determines that there is a pattern defect if the compared data are not identical.

As the pattern inspection apparatus described above, in addition to the apparatus which irradiates the inspection substrate with laser beams in order to obtain a transmission image or a reflection image of a pattern formed on the substrate, there has been developed another inspection apparatus which acquires a pattern image by scanning the inspection substrate with electron beams and detecting secondary electrons emitted from the inspection substrate along with the irradiation by the electron beams. Further, as to the inspection apparatus using electron beams, an apparatus which uses multiple beams is also developed. The pattern inspection apparatus using an electron beam (e.g., multiple electron beams) scans each small region of the inspection substrate with beams so as to detect a secondary electron. In that case, a so-called "step and repeat" operation is performed in which the position of the substrate to be inspected is fixed during beam scanning, and, after the scanning, the substrate to be inspected is moved to a next small region. By using multiple beams in an array of a plurality of beam rows in each of which beams are arranged in a straight line at the same pitch, a large number of beams can be arranged within a limited region, and therefore, it becomes possible to scan many small regions at one time simultaneously. Accordingly, improvement of throughput is expected. However, in the step and repeat operation, the settling time (overhead time) until the stage position is stabilized is needed for each stage movement. Since one scanning range (small region) is small, an enormous number of times of stage stepping is necessary to scan the entire substrate. Therefore, unnecessary time not used for scanning is generated by the amount of time calculated by multiplying the settling time by the number of times of stepping. Even when scanning the substrate with multiple beams, there is an estimate that, for example, unnecessary time for scanning of 80 hours or more is generated for one substrate.

Then, in order to improve the throughput of the inspection apparatus, it is examined to change the stage movement method from the step and repeat operation method to the continuous movement method which does not require a settling time for each step. However, when performing scanning with multiple beams in an array, although the settling time can be made unnecessary in the continuous movement method, instead, the same small region is sequentially sent to the scan ranges of a plurality of beams arranged in a line in the movement direction. Therefore, beams at the same arrangement position of the multiple beams perform scanning (imaging) of a next small region which is located skipping over small regions having already been scanned (imaged) by beams at another arrangement position (e.g., refer to Japanese Patent Application Laid-open (JP-A) No. 2018-017571). Thus, a small region imaged by beams at the same arrangement position is repeated at a certain cycle (pitch), skipping over a small region(s) imaged by a beam(s) at a different arrangement position(s).

Moreover, when performing a die-to-die inspection using multiple beams, it is desirable to inspect images captured by the beams at the same arrangement position (henceforth called the same beam) of the multiple beams. Thereby, beam characteristics, such as a beam shape, distortion, and/or brightness of each beam, can be coincident with each other, and therefore, inspection accuracy can be improved.

However, the cycle (pitch) of the small region whose image is captured by beams at the same arrangement position is fixed with respect to the device design. On the other hand, the arrangement cycle of the die formed on the substrate varies for each target object (substrate). Therefore, the cycle does not coincide.

There is disclosed an inspection apparatus which changes magnification so that the arrangement pitch of the region may be in accordance with the beam pitch of the multiple beams in order to expose each region by a single beam (e.g., refer to Japanese Patent Application Laid-open No. 2003-202661). However, if applying the method of this inspection apparatus to a die-to-die inspection, it is necessary to extend the beam pitch up to the arrangement pitch of the die, thereby being unpractical to be used in an actual device.

BRIEF SUMMARY OF THE INVENTION

According to one aspect of the present invention, a multiple charged particle beam inspection apparatus includes a stage configured to be movable and place thereon an inspection substrate where a plurality of dies on each of which a same pattern has been formed are arranged in a predetermined direction; a die pitch acquisition circuit configured to acquire an arrangement pitch of the plurality of dies; a magnification control circuit configured to control, in a case of imaging the inspection substrate by using multiple charged particle beams while continuously moving the stage, magnification of the multiple charged particle beams to be a controlled magnification such that the arrangement pitch of the plurality of dies becomes a natural number (2 or greater) multiple of an imaging region cycle in the predetermined direction of a plurality of imaging regions to be individually imaged by each beam at each arrangement position of the multiple charged particle beams; an inspection image acquisition mechanism configured to acquire inspection images of the plurality of dies arranged on the inspection substrate, using the multiple charged particle beams whose magnification has been controlled to be the controlled magnification; and a comparison circuit configured to compare the inspection images of the plurality of dies.

According to another aspect of the present invention, a multiple charged particle beam inspection method includes acquiring an arrangement pitch of a plurality of dies, on each of which a same pattern has been formed, arranged in a predetermined direction on an inspection substrate; controlling, in a case of imaging the inspection substrate by using multiple charged particle beams while continuously moving a stage, magnification of the multiple charged particle beams to be a controlled magnification such that the arrangement pitch of the plurality of dies becomes a natural number (2 or greater) multiple of an imaging region cycle in the predetermined direction of a plurality of imaging regions to be individually imaged by each beam at each arrangement position of the multiple charged particle beams; acquiring inspection images of the plurality of dies arranged on the inspection substrate, using the multiple charged particle beams whose magnification has been controlled to be the controlled magnification; and comparing the inspection images of the plurality of dies to output a comparison result.

BRIEF DESCRIPTION OF THE DRAWINGS

FIGS. 8A to 8F show examples of a relation between the number of beams and the division number according to the first embodiment;

FIGS. 15A and 15B illustrate a method of correcting a beam position on the substrate according to the second embodiment.

DETAILED DESCRIPTION OF THE INVENTION

Embodiments below describe an inspection apparatus and method which can image the same positions of dies to be compared, by beams at the same arrangement position when performing a die-to-die inspection using multiple beams in a line in the stage moving direction while continuously moving the stage.

Embodiments below describe a case using electron multiple beams as an example of multiple charged particle beams. The charged particle beam is not limited to the electron beam, and other charged particle beam such as an ion beam may also be used.

First Embodiment

Figure 1:
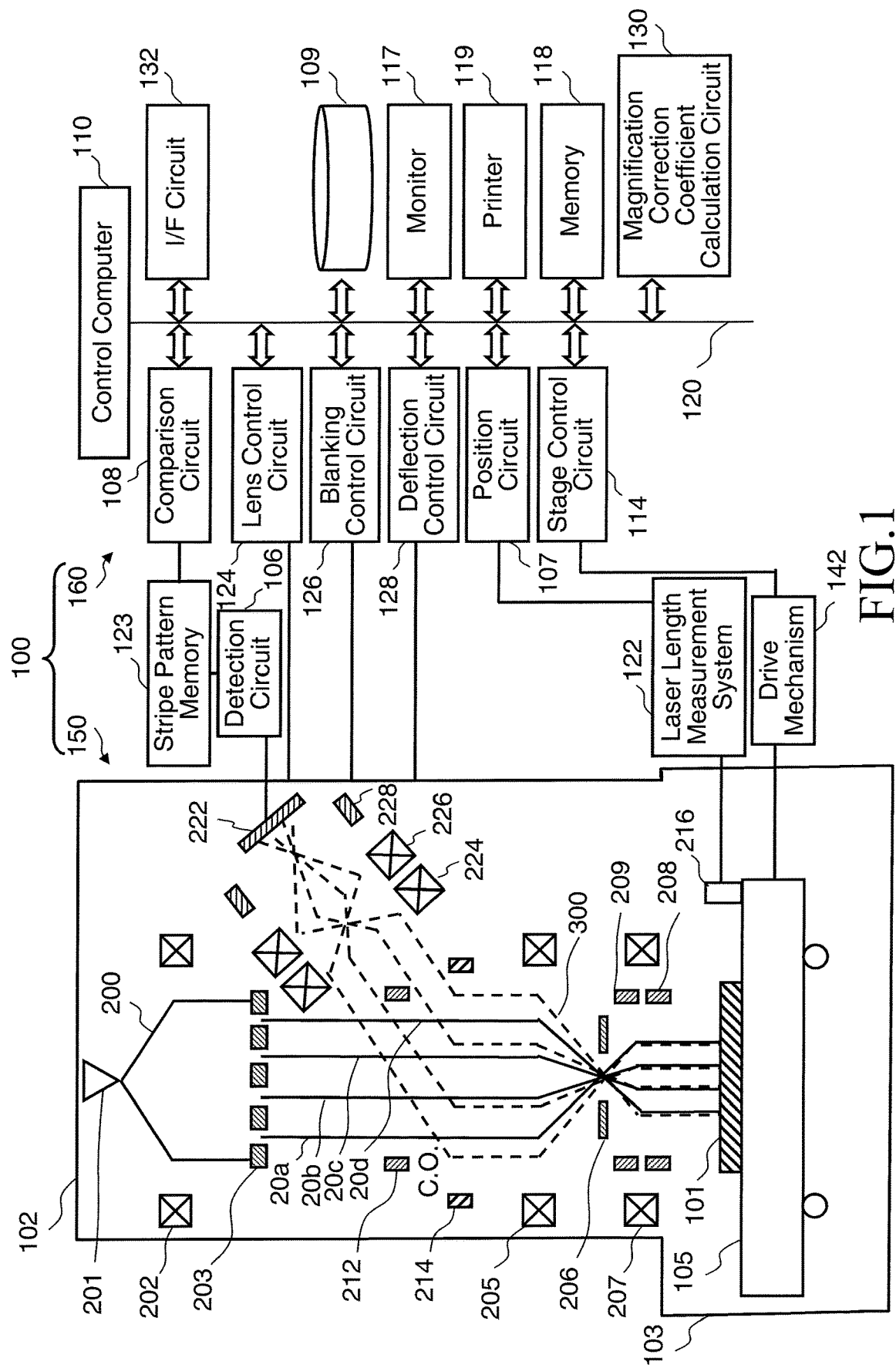
FIG. 1 shows a configuration of a pattern inspection apparatus according to a first embodiment.

FIG. 1 shows a configuration of a pattern inspection apparatus according to a first embodiment. In FIG. 1, an inspection apparatus 100 for inspecting patterns formed on the substrate is an example of a multiple charged particle beam inspection apparatus. The inspection apparatus 100 includes an image acquisition mechanism 150 and a control system 160. The image acquisition mechanism 150 includes an electron beam column 102 (electron optical column), an inspection chamber 103, a detection circuit 106, a stripe pattern memory 123, a stage drive mechanism 142, and a laser length measurement system 122. In the electron beam column 102, there are arranged an electron gun 201, an illumination lens 202, a shaping aperture array substrate 203, a reducing lens 205, a limiting aperture substrate 206, an objective lens 207, a main deflector 208, a sub deflector 209, a common blanking deflector 212, a beam separator 214, a projection lenses 224 and 226, a deflector 228, and a multi-detector 222.

In the inspection chamber 103, there is arranged an XY stage 105 which is movable at least in the x-y directions. On the XY stage 105, there is placed a substrate 101 on which a chip pattern to be inspected has been formed. The substrate 101 may be an exposure mask or a semiconductor substrate such as a silicon wafer. The substrate 101 is placed with its pattern forming surface facing upward, for example. Moreover, on the XY stage 105, there is arranged a mirror 216 which reflects a laser beam for measuring a laser length emitted from the laser length measurement system 122 arranged outside the inspection chamber 103. The detector 222 is connected, at the outside of the electron beam column 102, to the detection circuit 106. The detection circuit 106 is connected to the stripe pattern memory 123.

In the control system circuit 160, a control computer 110 which controls the whole of the inspection apparatus 100 is connected, through a bus 120, to a position circuit 107, a comparison circuit 108, a stage control circuit 114, a lens control circuit 124, a blanking control circuit 126, a deflection control circuit 128, a magnification correction coefficient calculation circuit 130, an interface (I/F) circuit 132, a storage device 109 such as a magnetic disk drive, a monitor 117, a memory 118, and a printer 119. Moreover, the stripe pattern memory 123 is connected to the comparison circuit 108. The XY stage 105 is driven by the stage drive mechanism 142 under the control of the stage control circuit 114. In the stage drive mechanism 142, for example, the XY stage 105 can be moved by a drive system, such as a three (x-, y-, and θ-) axis motor which moves in the x, y, and θ directions. For example, a step motor can be used as each of these X, Y, and θ motors (not shown). The XY stage 105 is movable in the horizontal direction and the rotation direction by the motors of the X-axis, Y-axis, and θ-axis. The movement position of the XY stage 105 is measured by the laser length measuring system 122, and supplied (transmitted) to the position circuit 107. Based on the principle of laser interferometry, the laser length measuring system 122 measures the position of the XY stage 105 by receiving a reflected light from the mirror 216.

To the electron gun 201, there is connected a high voltage power supply circuit (not shown). The high voltage power supply circuit applies an acceleration voltage between a filament (cathode) and an extraction electrode (anode) (which are not shown) in the electron gun 201. In addition to applying the acceleration voltage as described above, applying a predetermined voltage to an extraction electrode (Wehnelt) and heating the cathode to a predetermined temperature are performed, and thereby, electrons from the cathode are accelerated to be emitted as electron beams. For example, electromagnetic lenses are used as the illumination lens 202, the reducing lens 205, the objective lens 207, and the projection lenses 224 and 226, and all of them are controlled by the lens control circuit 124. The beam separator 214 is also controlled by the lens control circuit 124. Each of the common blanking deflector 212 and the deflector 228 is composed of at least two electrodes (or "at least two poles"), and controlled by the blanking control circuit 126. Each of The main deflector 208 and the sub deflector 209 is composed of at least four electrodes (or "at least four poles"), and controlled by the deflection control circuit 128.

In the case of the substrate 101 being a semiconductor wafer on which a plurality of chip (die) patterns are formed, pattern data of the chip (die) pattern is input from the outside of the inspection apparatus 100 to the storage device 109 to be stored therein. In the case of the substrate 101 being an exposure mask on which a plurality of chip (die) patterns are formed, design pattern data which is a basis for forming a mask pattern on the exposure mask is input from the outside of the inspection apparatus 100 to the storage device 109 to be stored therein.

FIG. 1 shows configuration elements necessary for describing the first embodiment. It should be understood that other configuration elements generally necessary for the inspection apparatus 100 may also be included therein.

Figure 2:
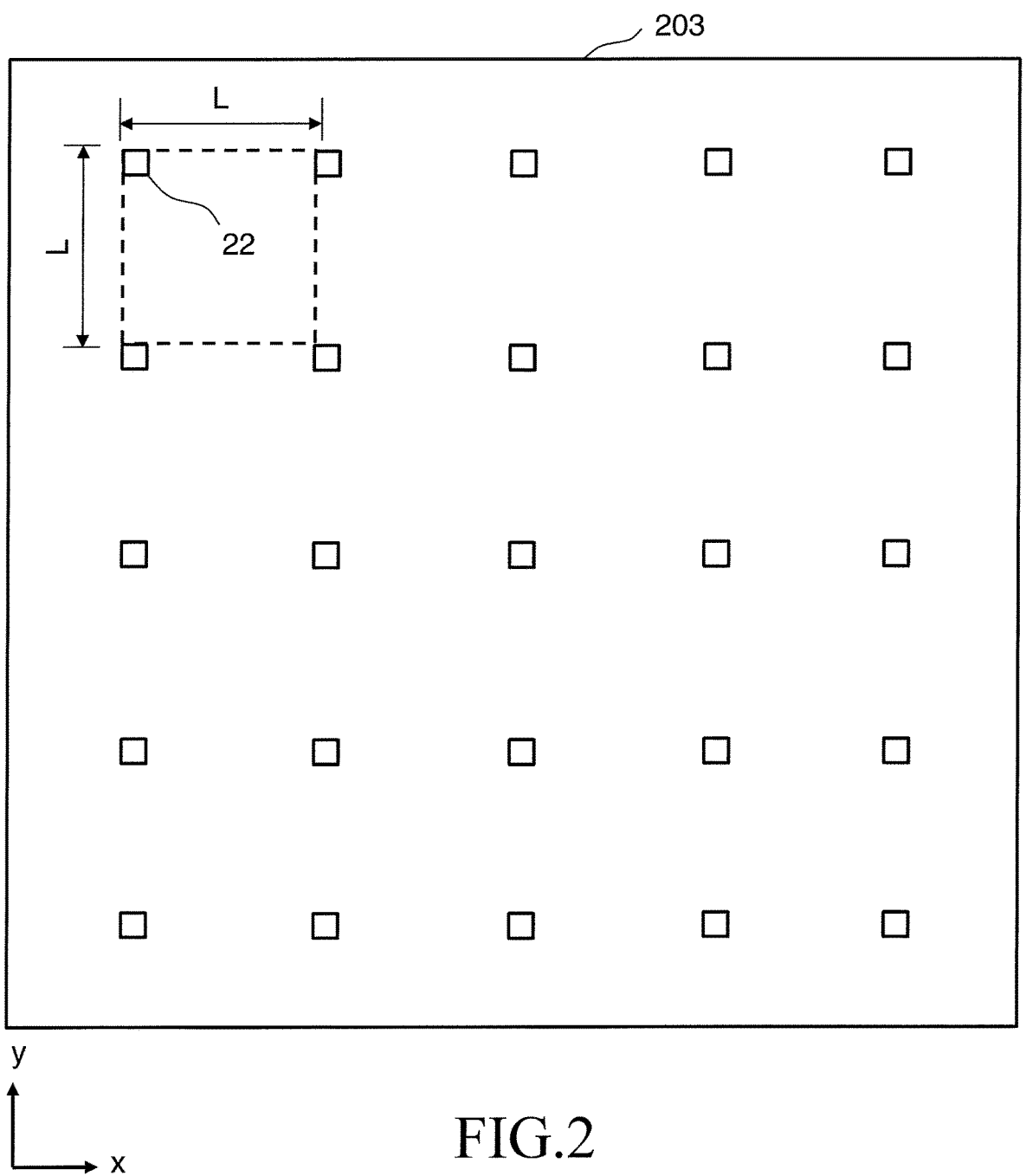
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of N columns wide (width in the x direction) and N' rows long (length in the y direction) (N being an integer of 2 or greater, N' being an integer of 1 or greater) are two-dimensionally (in a matrix) formed in the x and y directions (x: first direction, y: second direction) at a predetermined arrangement pitch L in the shaping aperture array substrate 203. In the case of the reduction ratio of multiple beams being "a" times (in the case of irradiating the substrate 101 with multiple beams whose diameter has been reduced to 1/a)), and the pitch between beams of the multiple beams, in the x and y directions, on the substrate 101 being Pb, the arrangement pitch L=(a×Pb). In the example of FIG. 2, a plurality of holes 22 for 5×5 (N=5, N'=5) multiple beams are formed. Next, operations of the image acquisition mechanism 150 in the inspection apparatus 100 will be described.

Figure 3:
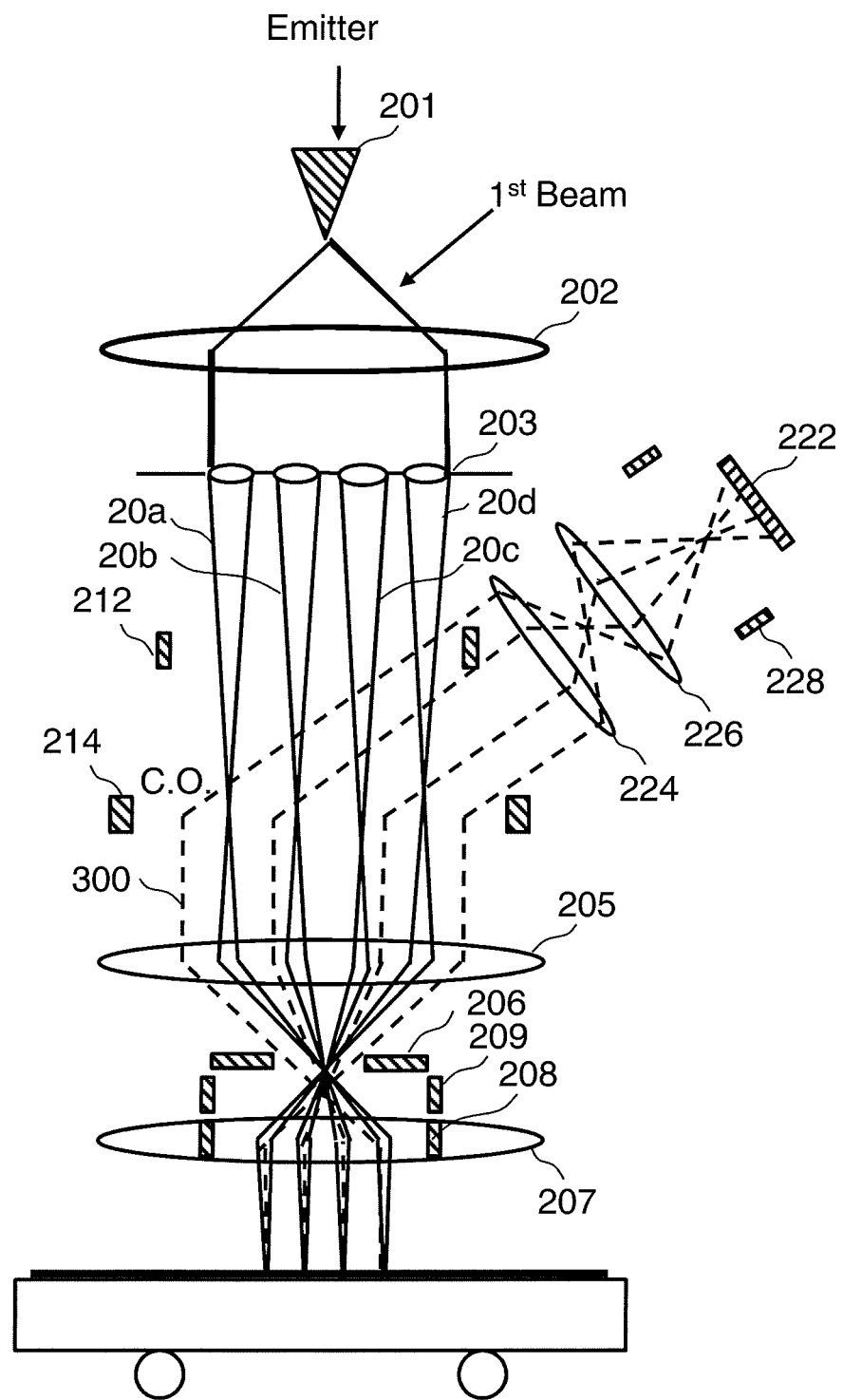
FIG. 3 illustrates a beam trajectory in an inspection apparatus according to the first embodiment.

FIG. 3 illustrates a beam trajectory in an inspection apparatus according to the first embodiment. An electron beam 200 emitted from the electron gun 201 (emission source) illuminates the whole of the shaping aperture array substrate 203 by the illumination lens 202. In the shaping aperture array substrate 203, there are formed a plurality of rectangular (including square) holes (openings) 22 as shown in FIG. 2, and the region including all the plurality of holes 22 is irradiated with the electron beam 200. For example, a plurality of rectangular or circular electron beams (multiple beams) (a plurality of electron beams) 20a to 20d (solid lines in FIGS. 1 and 3) are formed by making portions of the electron beam 200, which irradiates the positions of a plurality of holes 22, individually pass through a corresponding one of the plurality of holes 22 in txhe shaping aperture array substrate 203.

Then, the multiple beams 20a to 20d form a crossover (C.O.). After having passed through the beam separator 214 arranged at the crossover position of the multiple beams 20, the multiple beams 20a to 20d are reduced by the reducing lens 205, and go toward the hole in the center of the limiting aperture substrate 206. At this stage, when all of the multiple beams 20a to 20d are collectively deflected by the common blanking deflector 212 placed between the shaping aperture array substrate 203 and the reducing lens 205, they deviate from the hole in the center of the limiting aperture substrate 206 to be blocked by the limiting aperture substrate 206. On the other hand, the multiple beams 20a to 20d which were not deflected by the common blanking deflector 212 pass through the hole in the center of the limiting aperture substrate 206 as shown in FIG. 1. Blanking control is provided by ON/OFF of the common blanking deflector 212 to collectively control ON/OFF of beams. Thus, the limiting aperture substrate 206 blocks the multiple beams 20a to 20d which were deflected to be in the OFF condition by the common blanking deflector 212. Then, the multiple beams 20a to 20d are formed by beams having been made during a period from becoming "beam ON" to becoming "beam OFF" and having passed through the limiting aperture substrate 206. The multiple beams 20a to 20d having passed through the limiting aperture substrate 206 become multiple beams of desired magnification M1 at, for example, the magnetic field center height of the objective lens 207, and are focused by the objective lens 207 to be a multiple beam image (beam diameter) of desired reduction ratio M1. Then, all the multiple beams 20 having passed through the limiting aperture substrate 206 are collectively deflected in the same direction by the main deflector 208 and the sub deflector 209 in order to irradiate respective beam irradiation positions on the substrate 101. In such a case, the main deflector 208 collectively deflects all of the multiple beams 20 so that a reference position of a unit inspection region to be described later, which is to be scanned by each beam, may be individually irradiated, and also, tracking deflection is performed to follow the movement of the XY stage 105. Then, the sub deflector 209 collectively deflects all the multiple beams 20 so that each beam may scan N×N' sub irradiation regions 29 in a corresponding unit inspection region. Ideally, the multiple beams 20 irradiating at a time are aligned at the pitch obtained by multiplying the arrangement pitch L (=aPb) of a plurality of holes 22 in the shaping aperture array substrate 203 by the desired reduction ratio (1/a) described above. Thus, the electron beam column 102 emits two-dimensional N×N' multiple beams 20 at a time to irradiate the substrate 101. A flux of secondary electrons (multiple secondary electrons 300) (dotted lines in FIGS. 1 and 3) corresponding to each beam of the multiple beams 20 is emitted from the substrate 101 due to irradiation of the multiple beams 20 at desired positions on the substrate 101.

The multiple secondary electrons 300 emitted from the substrate 101 are refracted toward the center of the multiple secondary electrons 300 by the objective lens 207, and travel toward the center hole of the limiting aperture substrate 206. The multiple secondary electrons 300 having passed through the limiting aperture substrate 206 are refracted almost parallel to the optical axis by the reducing lens 205, and travel to the beam separator 214.

The beam separator 214 generates an electric field and a magnetic field to be orthogonal to each other in a plane perpendicular to the traveling direction (optical axis) of the multiple beams 20. The electric field affects (exerts a force) in a fixed direction regardless of the traveling direction of electrons. In contrast, the magnetic field affects (exerts a force) according to Fleming's left-hand rule. Therefore, the direction of force acting on (applied to) electrons can be changed depending on the traveling (or "entering") direction of the electrons. With respect to the multiple beams 20 (primary electron beams) entering the beam separator 214 from the upper side, since the force due to the electric field and the force due to the magnetic field cancel each other out, the multiple beams 20 travel straight downward. In contrast, with respect to the multiple secondary electrons 300 entering the beam separator 214 from the lower side, since both the force due to the electric field and the force due to the magnetic field are exerted in the same direction, the multiple secondary electrons 300 are bent obliquely upward.

The multiple secondary electrons 300 bent obliquely upward are projected onto the multi-detector 222 while being refracted by the projection lenses 224 and 226. The multi-detector 222 detects the projected multiple secondary electrons 300. The multi-detector 222 includes a diode type two-dimensional sensor (not shown), for example. Then, at the position of the diode type two-dimensional sensor corresponding to each beam of the multiple beams 20, each secondary electron of the multiple secondary electrons 300 collides with the diode type two-dimensional sensor to produce an electron, and generate secondary electron image data for each pixel to be described later. The deflector 228 deflects the multiple secondary electrons 300 so that the multi-detector 222 can detect the multiple secondary electrons 300 in accordance with the tracking operation described above.

Figure 4:
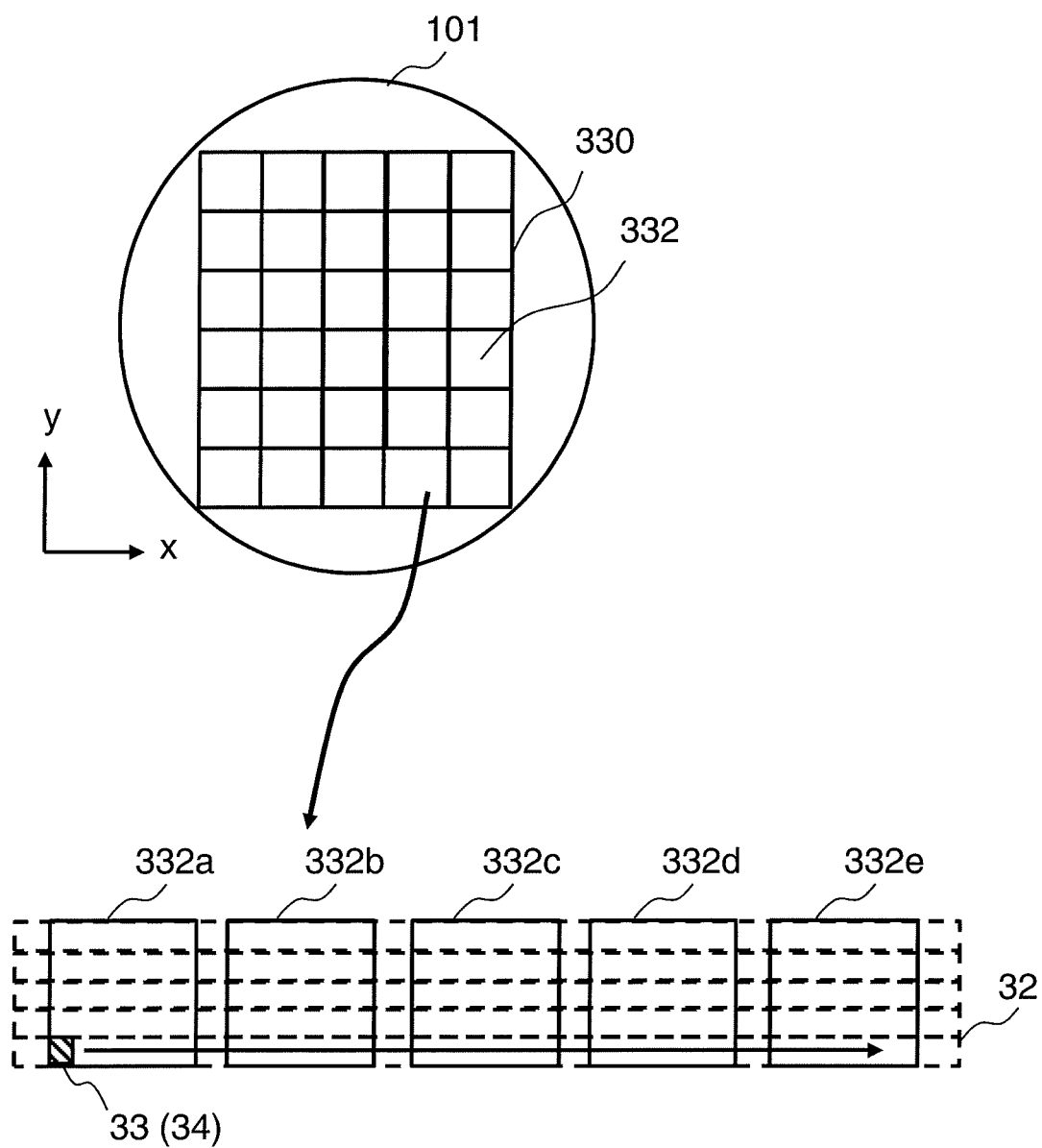
FIG. 4 is a conceptual diagram illustrating an example of a scanning operation according to the first embodiment.

FIG. 4 is a conceptual diagram illustrating an example of a scanning operation according to the first embodiment. In FIG. 4, when the substrate 101 is a semiconductor substrate (wafer), a plurality of wafer dies (chips) 332 in a two-dimensional array are formed in an inspection region 330 of the semiconductor substrate 101. A mask pattern for one chip formed on the exposure mask substrate is reduced to ¼, for example, and exposed/transferred onto each wafer die 332 by an exposure device (stepper) (not shown). In other words, a plurality of wafer dies 332 (dies) on each of which the same pattern has been formed are arranged in a predetermined direction (here, x direction and y direction) on the inspection substrate 101. The inspection region 330 of the substrate 101 is virtually divided into a plurality of stripe regions 32 each in the shape of a strip and each having a predetermined width in the y direction, for example. That is, each stripe region 32 is set such that it extends over a plurality of wafer dies 332 (332a to 332e) arranged in a line in the x direction. In the example of FIG. 4, the inspection region 330 is virtually divided into a plurality of stripe regions 32 each in the shape of a strip and each having a width the same as the y direction size of the irradiation region 34 of the whole multiple beams 20, for example. The irradiation region 34 is, for example, a rectangular (including square) region whose x direction size is obtained by multiplying the beam pitch Pb in the x direction of the multiple beams 20 by N being the number of beams in the x direction, and whose y direction size is obtained by multiplying the beam pitch Pb in the y direction of the multiple beams 20 by N' being the number of beams in the y direction. Also, when the substrate 101 is an exposure mask substrate, similarly, the inspection region of the substrate 101 may virtually be divided into a plurality of stripe regions 32 each in the shape of a strip and each having a predetermined width in the y direction. First, the XY stage 105 is moved to adjust a tracking region 33 so that the irradiation region 34, which can be irradiated with one irradiation of the multiple beams 20, may be located outside of the first stripe region 32, for example, being outside by the size of one irradiation region 34 from the left end of the first stripe region 32, and then, a scanning operation is started. According to the first embodiment, tracking reset is performed by continuously moving the XY stage 105 in the −x direction (reverse direction to the first direction) at a constant speed, for example, scanning the sub irradiation region concerned (sub irradiation region 29 to be described later) in a desired tracking region 33 with each beam while moving the irradiation region 34 to follow the continuous movement, and after them, moving the irradiation region 34 in the x direction (the first direction) to a next tracking region 33. By repeating this operation, the stripe regions 32 are scanned in order in the x direction. When scanning the first stripe region 32, the XY stage 105 is moved in the −x direction, for example, so that the scanning operation advances relatively in the x direction. After completing the irradiation of the multiple beams to the first stripe region 32, the stage position is moved in the −y direction to make an adjustment such that the irradiation region 34 is located, relatively in the y direction, at a position further left than the left end of the second stripe region 32 by the size of one irradiation region 34. Then, similarly, the scanning operation is performed in the x direction. Alternatively, scanning may be performed while changing the direction alternately between the first stripe region 32 and the second stripe region 32. The irradiation region 34 of the multiple beams 20 is smaller than the region size of the wafer die 332. Therefore, all the regions of a plurality of wafer dies 332 arranged in a line in the x direction can be imaged by performing a scanning operation of a plurality of stages. The multiple secondary electrons 300 being a flux of secondary electrons corresponding to a plurality of beams (primary electron beams) whose maximum number is equal to the number of the holes 22 are simultaneously detected by using the multiple beams 20 which have been formed by individually passing through each of the holes 22 in the shaping aperture array substrate 203.

Figure 5:
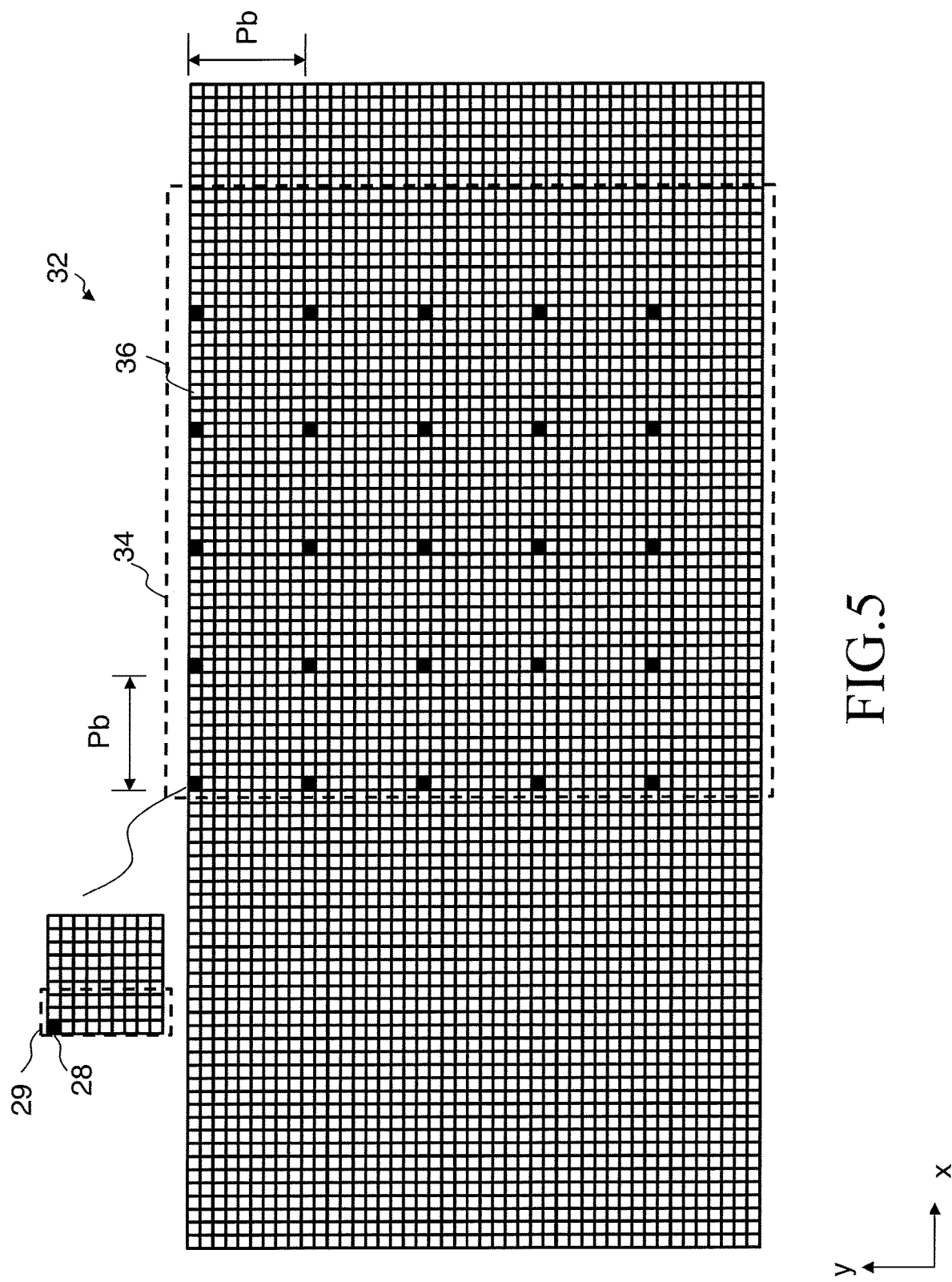
FIG. 5 shows an example of an irradiation region of multiple beams and a measurement pixel according to the first embodiment.

FIG. 5 shows an example of an irradiation region of multiple beams and a measurement pixel according to the first embodiment. In FIG. 5, each stripe region 32 is divided into a plurality of mesh regions by the beam size of the multiple beams, for example. Each mesh region serves as a measurement pixel 36 (unit irradiation region). In the irradiation region 34, there are shown a plurality of measurement pixels 28 (irradiation positions of beams of one shot) which can be irradiated with one irradiation of the N×N' multiple beams 20. In other words, the reference arrangement pitch Pb in the x and y directions, between adjacent measurement pixels 28 serves as the pitch between beams of the multiple beams 20. In the example of FIG. 5, one sub irradiation region 29 (small region) is configured by a rectangular region having a width of Pb/M in the x direction and a length of Pb in the −y direction, and obtained by dividing by a division number M (M being an integer of 2 or greater) the region of Pb×Pb in which one of four adjacent measurement pixels 28 serves as one of the four corners of the rectangular region, and which is surrounded by Pb as the x direction side and Pb as the y direction side, in other words the region of Pb×Pb extending Pb in the x direction and Pb in the −y direction starting from the measurement pixel 28 concerned. In the case of FIG. 5, each sub irradiation region 29 (individual beam scan region) is composed of 3×9 pixels.

Figure 6:
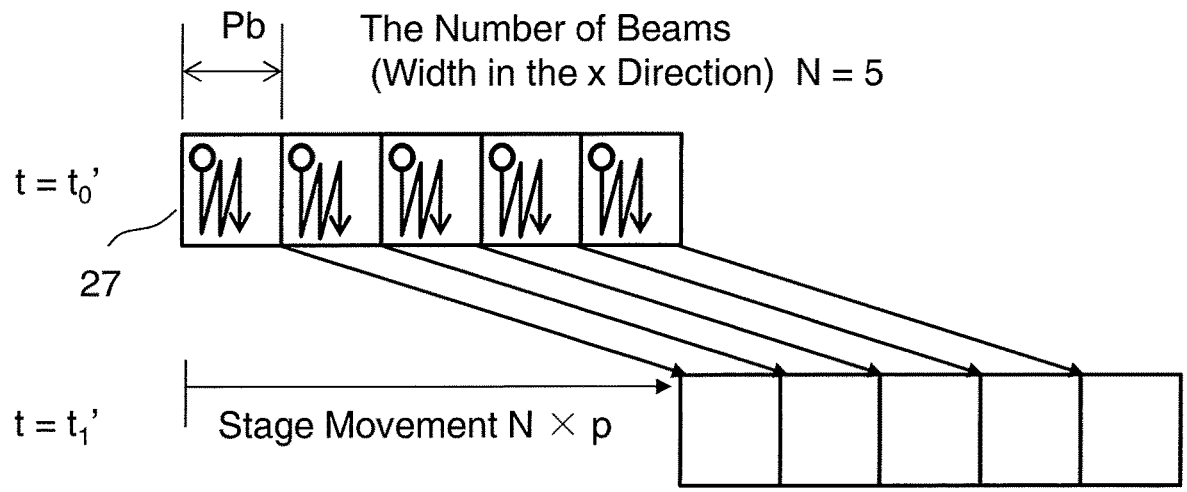
FIG. 6 is a conceptual diagram illustrating an example of details of scanning operation according to a comparative example of the first embodiment.

FIG. 6 is a conceptual diagram illustrating an example of details of scanning operation according to a comparative example of the first embodiment. The case of FIG. 6 shows one row of N multiple beams in a line in the x direction in N×N' multiple beams 20, as a comparative example of the first embodiment. Here, multiple (N=5) beams are arranged in the x direction at the same pitch Pb. In the comparative example of the first embodiment, after each beam of the multiple (N=5) beams arranged in the x direction with the same pitch Pb scans the whole of the region of Pb×Pb, surrounded by Pb (x direction side) and Pb (y direction side), in other words, the region extending Pb in the x direction and Pb in the −y direction starting from the measurement pixel 28 of the beam concerned, scanning is performed for a next region 27 surrounded by Pb×Pb. In the comparative example of the first embodiment, the stage speed is controlled so that the XY stage 105 may move by N·Pb during the period (t=$t_0$' to $t_1$') while each beam scans the region 27 surrounded by Pb×Pb. In such a case, the main deflector 208 performs tracking deflection so that each beam can scan the region surrounded by Pb×Pb by deflection operation of the sub deflector 209. Then, at the time (t=$t_1$') when scanning of N regions 27 continuously arranged in a line in the x direction, each surrounded by Pb×Pb, has been completed, tracking reset is performed by collectively deflecting multiple (N=5) beams in the x direction in order that scanning regions may not overlap with each other. By repeating this operation, scanning with multiple beams can be performed in a manner such that the scanning regions may not overlap with each other in the region on the stage continuously moving. In the example of FIG. 6, it is necessary to deflect the multiple beams in the x direction (or −x direction) by (N−1)·Pb (=4Pb). Therefore, the deflection range of (N−1)·Pb of beam deflection in the x direction (or −x direction) is needed in the comparative example of the first embodiment. On the other hand, the deflection range of Pb of beam deflection in the y direction (or −y direction) is needed. If the number of beams, N, increases, the deflection range of beam deflection becomes very large. Therefore, the influence of aberration of the electron optical system becomes large.

Figure 7:
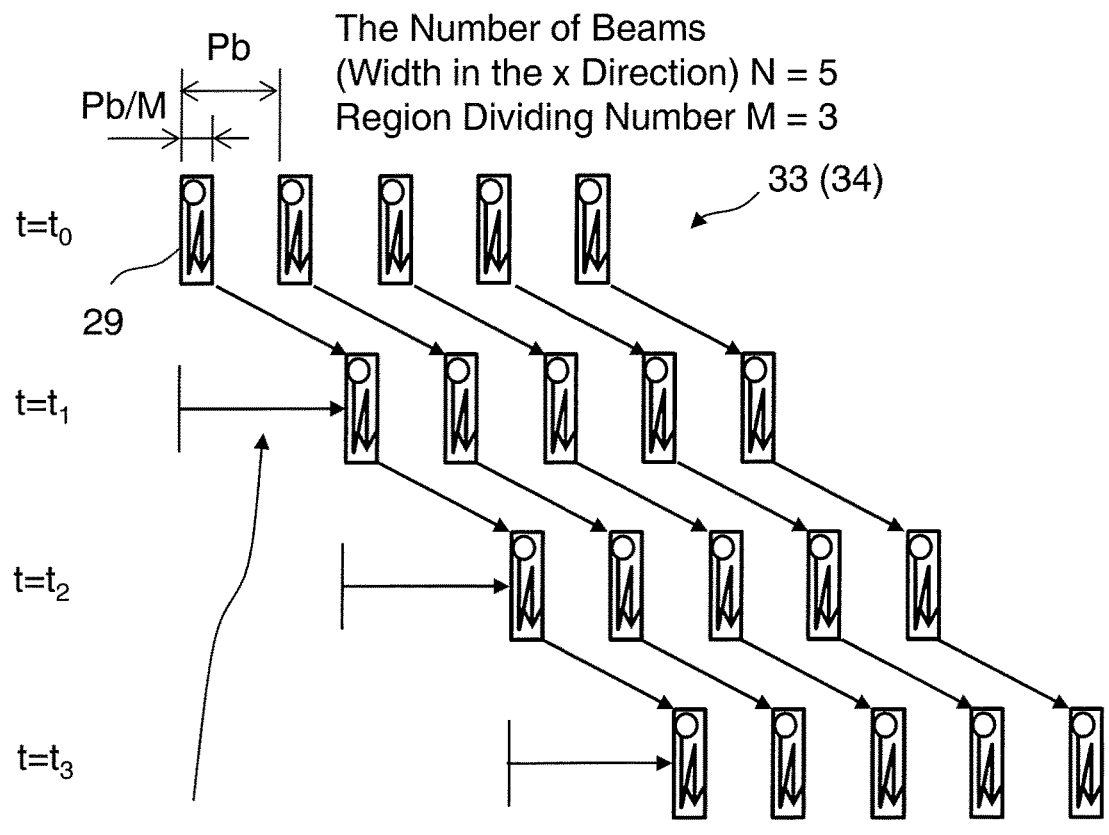
FIG. 7 is a conceptual diagram illustrating an example of details of scanning operation according to the first embodiment.

FIG. 7 is a conceptual diagram illustrating an example of details of scanning operation according to the first embodiment. The case of FIG. 7 shows one row of N multiple beams in a line in the x direction in N×N' multiple beams 20, as the first embodiment. Here, similarly to FIG. 6, there are shown multiple (N=5) beams arranged in the x direction with the same pitch Pb. According to the first embodiment, the region 27 being a rectangle in which one of four adjacent measurement pixels 28 serves as one of the four corners of the rectangle, and which is surrounded by Pb as the x direction side and Pb as the y direction side, in other words the region of Pb×Pb extending Pb in the x direction and Pb in the −y direction starting from the measurement pixel 28 concerned is divided in the x direction by the division number M. Therefore, one sub irradiation region 29 (small region) is configured by a rectangular region of predetermined size where the width is Pb/M in the x direction and the length is Pb in the −y direction. FIG. 7 shows the case of the division number M=3. According to the first embodiment, after each beam of the multiple (N=5) beams in the x direction with the same pitch Pb scans the sub irradiation region 29 of the predetermined size whose width is Pb/M in the x direction and length is Pb in the −y direction starting from the measurement pixel 28 of the beam concerned, scanning is performed for a next sub irradiation region 29 away by N sub irradiation regions 29 in the x direction.

In FIG. 7, according to the first embodiment, during the period (t=$t_0$ to $t_1$) while each beam scans the sub irradiation region 29 surrounded by (Pb/M)×Pb, if the stage speed is the same as that of the comparative example of FIG. 6, the XY stage 105 moves by N/M·Pb. In other words, during the period while each beam irradiates the sub irradiation region 29 surrounded by (Pb/M)×Pb, the stage control circuit 114 controls the XY stage 105 so that it may move by N/M·Pb by continuous movement. In such a case, the main deflector 208 performs tracking deflection so that each beam can scan the sub irradiation region 29 surrounded by (Pb/M)×Pb by deflection operation of the sub deflector 209 while regarding N sub irradiation regions 29, each being (Pb/M)×Pb, in a line in the x direction at the pitch Pb as the tracking region 33. Then, at the time (t=$t_1$') when the sub deflector 209 completes scanning of N sub irradiation regions 29, each being (Pb/M)×Pb, arranged in the x direction at the pitch Pb, the main deflector 208 performs tracking reset by collectively deflecting multiple (N=5) beams in the x direction to the position away by N sub irradiation regions 29 in order that scanning regions may not overlap with each other. In the example of FIG. 7, the main deflector 208 collectively deflects five multiple beams to the position away by five sub irradiation regions 29. In such a case, it goes without saying that the deflection position of the sub deflector 209 is reset to the first pixel 28 from the last pixel 36 in the sub irradiation region 29. By repeating this operation during the period t=$t_1$ to $t_2$, the period t=$t_2$ to $t_3$, and so on, it becomes possible to perform scanning with multiple beams so that scan regions may not overlap with each other on the same stripe region 32 even when the stage is continuously moved. In the example of FIG. 7, multiple beams need to be deflected in the x direction (or −x direction) by (N−1)/M·Pb (=4Pb/M). Therefore, according to the first embodiment, the deflection range of beam deflection in the x direction (or −x direction) can be suppressed to (N−1)/M·Pb. However, if the relation between the number of beams, N, in the x direction and the division number M is not controlled, scanning omission or dual scanning of the sub irradiation region 29 (sub region) occurs. According to the first embodiment, for applying this scanning method, the value of combination is used which makes 1 the greatest common divisor between the number of beams, N, in the x direction and the division number M. By using this condition, it becomes possible to avoid the scanning omission or dual scanning.

FIGS. 8A to 8F show examples of a relation between the number of beams and the division number according to the first embodiment. FIGS. 8A to 8F show scanning operation in which the division number M is changed while the number of beams is set to be N=7 in the x direction. In FIGS. 8A to 8F, whenever tracking reset is performed, the row is shifted. For convenience, in FIGS. 8A to 8F, the size in the y direction of the region 27 surrounded by Pb×Pb has been decreased. As a comparative example, FIG. 8A shows the case where the division number M is one (M=1), that is, the region 27 surrounded by Pb×Pb is not divided. If tracking reset is performed in FIG. 8A, the deflection range of beam deflection becomes large to be 6Pb. Therefore, preferably, the division number M is a natural number (positive integer) of 2 or greater. FIG. 8B shows the case where the division number M is two (M=2), that is, the region 27 surrounded by Pb×Pb is divided into two.

In FIG. 8B, when tracking reset is performed, the deflection range of beam deflection can be reduced to 3Pb. FIG. 8C shows the case where the division number M is three (M=3), that is, the region 27 surrounded by Pb×Pb is divided into three. In FIG. 8C, when tracking reset is performed, the deflection range of beam deflection can be reduced to 2Pb. FIG. 8D shows the case where the division number M is four (M=4), that is, the region 27 surrounded by Pb×Pb is divided into four. In FIG. 8D, when tracking reset is performed, the deflection range of beam deflection can be reduced to (3/2) Pb. FIG. 8E shows the case where the division number M is five (M=5), that is, the region 27 surrounded by Pb×Pb is divided into five. In FIG. 8E, when tracking reset is performed, the deflection range of beam deflection can be reduced to (6/5)Pb. FIG. 8F shows the case where the division number M is six (M=6), that is, the region 27 surrounded by Pb×Pb is divided into six. In FIG. 8F, when tracking reset is performed, the deflection range of beam deflection can be reduced to Pb. Thus, the deflection range of beam deflection can be smaller by making the division number M larger.

According to the first embodiment, when each region 27 surrounded by Pb×Pb is divided by M, there obtain M sub irradiation regions 29 per one region 27. If one beam scans one sub irradiation region 29, when N multiple beams 20 in the x direction are used for the scanning, N sub irradiation regions 29 with (M−1) sub irradiation regions 29 therebetween, are scanned simultaneously. Here, a group of M×N consecutive sub irradiation regions 29 is regarded as one span. When the first beam in the x direction in the multiple beams 20 moves one span, the sub irradiation regions which could not be scanned will remain as it is without being scanned. Here, if the number of the sub irradiation regions to be skipped, that is a movement amount, in tracking reset is defined as D, tracking cycle operations of M×N/D times are performed while the first beam in the x direction in the multiple beams 20 moves one span. Therefore, as the sub irradiation regions with (M−1) sub irradiation regions 29 therebetween scanned by one scanning operation, in order that all sub irradiation regions can be scanned without overlapping and skipping, the division number M and the number of times of tracking cycle operations need to be the same, that is M=M×N/D. Accordingly, D=N. Therefore, according to the first embodiment, the number D indicating the number of sub irradiation regions to be skipped in tracking reset is the same as N being the number of beams in the x direction. In that case, the deflection range of the beam is (N−1)Pb/M.

If N sub regions (sub irradiation regions 29) with (M−1) sub irradiation regions 29 therebetween, being one set, are scanned simultaneously, and the number of the sub regions to be skipped in tracking reset is defined as N, the following relations are required in order that the scanning ranges may not overlap with each other in one span.
0, M, 2M, 3M, . . . , (N−1)M, NM
0, N, 2N, 3N, . . . , (M−1) M, MN It is necessary to make these two sequences not be the same value during the process. Therefore, the value (disjoint relation between the number of beams, N, and the division number M) of combination which makes the greatest common divisor between the number of beams, N, in the x direction and the division number M be 1 is needed. In the examples of FIG. 8A to FIG. 8F, if the division number M=7, the two sequences become the same value during the process. Specifically, when performing tracking reset, since the sub region after moving has already been scanned with the adjacent beam, overlapping occurs resulting in NG.

As shown in the examples of FIG. 8A to FIG. 8F, it is preferable to use a prime number as the number of beams, N. By making the number of beams, N, be a prime number (e.g., 2, 3, 5, 7, 11, 13, 17, 23, . . . ), the degree of freedom of the division number M can be increased dramatically.

The beam deflection range can be decreased by increasing the division number M. Therefore, preferably, the division number is large from a viewpoint of decreasing the beam deflection range. On the other hand, if the division number M is increased, the number of portions overlapped increases because the number of the sub irradiation regions 29 increases, thereby increasing the number of times of tracking control (the number of times of tracking cycles) to be of no use. Therefore, it is more preferable to select the minimum value of the division number M providing the beam deflection range where the influence of aberration of the electron optical system can be disregarded.

Figure 9A:
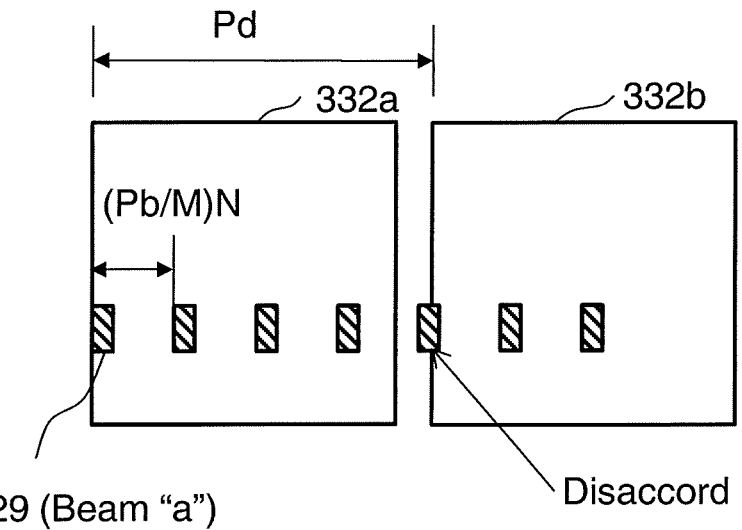
FIGS. 9A and 9B show examples of a relation between a region to be scanned by one of multiple beams and a plurality of dies according to the first embodiment.
Figure 9B:
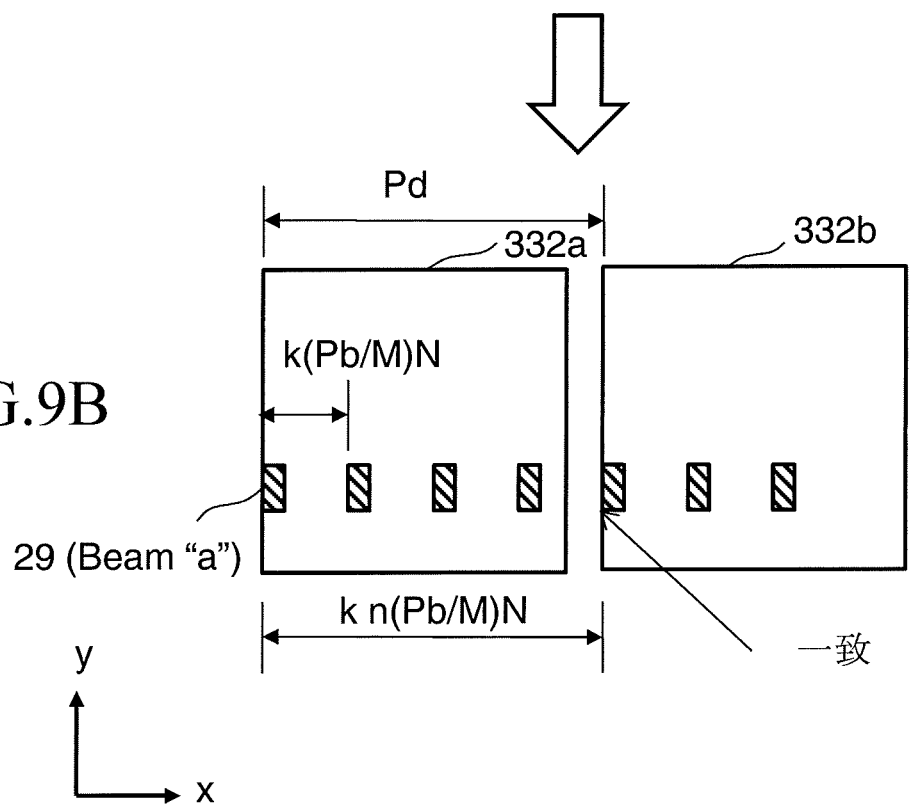

FIGS. 9A and 9B show examples of a relation between a region to be scanned by one of multiple beams and a plurality of dies according to the first embodiment. As explained in FIG. 7, each beam of the multiple beams 20 irradiates (scans), at the pitch (Pb/M)N, the sub irradiation region 29 of the size (predetermined size) of Pb/M as the x direction side and Pb as the −y direction side. Therefore, as shown in FIG. 9A, each beam scans, in order, the sub irradiation regions 29 arranged at the pitch (Pb/M)N regardless the arrangement pitch Pd of a plurality of wafer dies 332. Accordingly, the position of the sub irradiation region 29 to be scanned by the beam "a" on the wafer die 332a is usually different from that on the wafer die 332b. Therefore, if a die-to-die inspection is perform between the wafer die 332a and the wafer die 332b, it is difficult to perform the inspection between images taken by the same beam "a".

Then, according to the first embodiment, as shown in FIG. 9B, the arrangement pitch of the sub irradiation region 29 is adjusted so that the arrangement pitch Pd of a plurality of wafer dies 332 may be an integer multiple of the arrangement pitch of the sub irradiation region 29 to be irradiated (scanned) by each beam. Thus, it is necessary that the following relational expression (1) should be satisfied using the arrangement pitch Pd of a plurality of wafer dies 332, the arrangement number N in a predetermined direction (here, the x direction) of the multiple beams 20, the reference arrangement pitch Pb in the x direction of the multiple beams 20 on the inspection substrate 101, the division number M (M being an integer of 2 or greater) used for dividing the reference arrangement pitch Pb, and a natural number (positive integer) n.

$$Pd = k \cdot n \cdot (Pb/M)N \qquad (1)$$

k is a magnification correction coefficient. In the first embodiment, the arrangement pitch of the sub irradiation region 29 is adjusted using the magnification of an image of the multiple beams 20 on the substrate 101. The magnification correction coefficient k for making the arrangement pitch Pb of a plurality of wafer dies 332 be a magnification of an integer multiple of the arrangement pitch of the sub irradiation region 29 which is to be irradiated (scanned) by each can be defined by the following equation (2), transformed from the relational expression (1), using the arrangement pitch Pd of a plurality of wafer dies 332, the arrangement number N in a predetermined direction (here, the x direction) of the multiple beams 20, the reference arrangement pitch Pb in the x direction of the multiple beams 20 on the inspection substrate 101, the division number M (M being an integer of 2 or greater) used for dividing the reference arrangement pitch Pb, and a natural number (positive integer) n.

$$k = Pd \cdot M/(n \cdot N \cdot Pb) \qquad (2)$$

Here, it is preferable that the natural number (positive integer) n is set such that the magnification correction coefficient k may be a value close to 1 as much as possible. Thereby, the magnification correction amount can be minimized, and the load of the optical system of the inspection apparatus 100 can be small. As a result, generation of aberration in the optical system due to the magnification adjustment can be reduced as much as possible. The natural number (positive integer) n is set to be 2 or greater. If n=1, it becomes necessary to extend the arrangement pitch of the sub irradiation region 29 of each beam to the arrangement pitch of the die, and therefore, the load of the optical system is too large to be used in the actual device.

By adjusting the magnification of the image of the multiple beams 20 by using the magnification correction coefficient k which satisfies the equation (2), as shown in FIG. 9B, it becomes possible to make the arrangement pitch Pd of a plurality of wafer dies 332 be an integer multiple of the arrangement pitch of the sub irradiation region 29 which is to be irradiated (scanned) with each beam. Therefore, when a die-to-die inspection is performed between the wafer die 332a and the wafer die 332b, it is possible to perform the inspection between images taken by the same beam "a". Although the case wafer die 332b of performing the die-to-die inspection between the adjacent wafer die 332a and wafer die 332b is described here, it is not limited thereto. Even when the die-to-die inspection is performed between the wafer die 332a and another wafer die 332 arranged in the x direction other than the wafer die 332b, it is possible to perform the inspection between images taken by the same beam "a".

Figure 10:
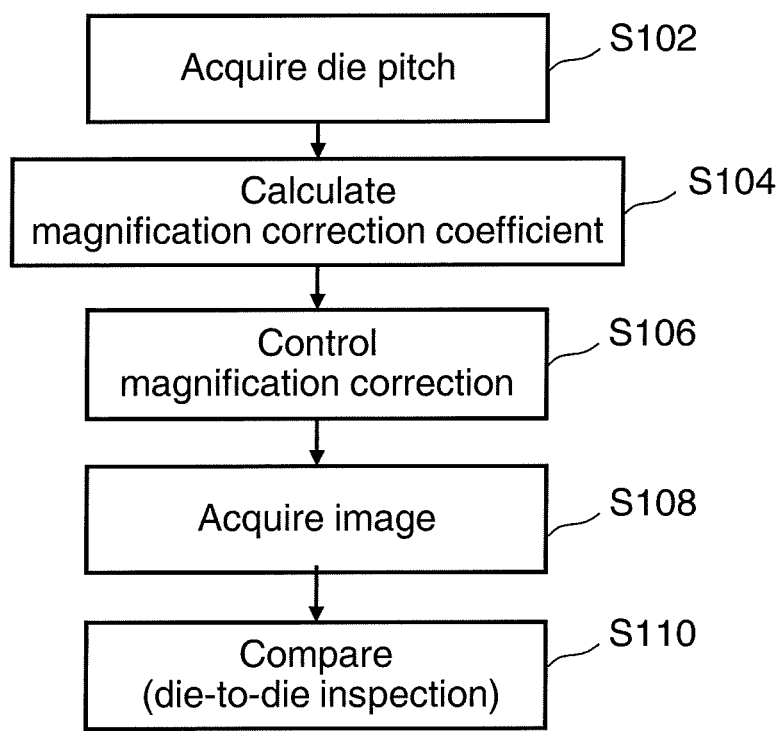
FIG. 10 is a flowchart showing main steps of an inspection method according to the first embodiment.

FIG. 10 is a flowchart showing main steps of an inspection method according to the first embodiment. In FIG. 10, the inspection method of the first embodiment executes a series of steps: a die pitch acquisition step (S102), a magnification correction coefficient calculation step (S104), a magnification correction control step (S106), an image acquisition step (S108), and a comparison (die-to-die inspection) step (S110).

In the die pitch acquisition step (S102), under the control of the control computer 110, the I/F circuit 132 (die pitch acquisition unit) acquires (inputs) the arrangement pitch Pd of a plurality of wafer dies 332 formed on the inspection substrate 101 from the user (from the outside of the inspection apparatus 100) through a keyboard, an external memory device, etc. (not shown). The acquired arrangement pitch Pd of a plurality of wafer dies 332 is output to the magnification correction coefficient calculation circuit 130, and also stored in the storage device 109. In the storage device 109, the arrangement number N in a predetermined direction (here, the x direction) of the multiple beams 20 of the inspection apparatus 100, the reference arrangement pitch Pb in the x direction of the multiple beams 20 on the inspection substrate 101, and the division number M (M being an integer of 2 or greater) used for dividing the reference arrangement pitch Pb have already been stored.

In the magnification correction coefficient calculation step (S104), in the case of imaging the inspection substrate 101 by using the multiple beams 20 while continuously moving the XY stage 105, the magnification correction coefficient calculation circuit 130 calculates a magnification correction coefficient k by which the arrangement pitch Pd of a plurality of wafer dies 332 can become a positive integer (2 or greater) multiple of the cycle (imaging region cycle: arrangement pitch) of the sub irradiation region 29 in the x direction (predetermined direction) of a plurality of sub irradiation regions 29 (imaging regions) to be individually imaged by each beam at each arrangement position of the multiple beams 20. The magnification correction coefficient k can be calculated by the equation (2) described above. The calculated magnification correction coefficient k is output to the lens control circuit 124.

In the magnification correction control step (S106), controlling the reducing lens 205 in the case of imaging the inspection substrate 101 by using the multiple beams 20 while continuously moving the XY stage 105, the lens control circuit 124 (an example of a magnification control circuit) controls the magnification of the multiple beams 20 such that the arrangement pitch Pd of a plurality of wafer dies 332 becomes a positive integer n (n being 2 or greater) multiple of the cycle (imaging region cycle: arrangement pitch) of the sub irradiation region 29 in the x direction (predetermined direction) of a plurality of sub irradiation regions 29 (imaging regions) to be individually imaged by each beam at each arrangement position of the multiple beams 20.

Figure 11A:
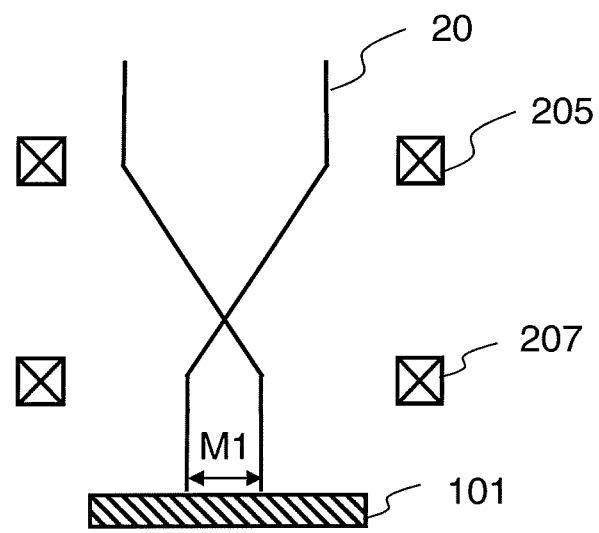
FIGS. 11A and 11B show examples of a state before and after magnification adjustment according to the first embodiment.
Figure 11B:
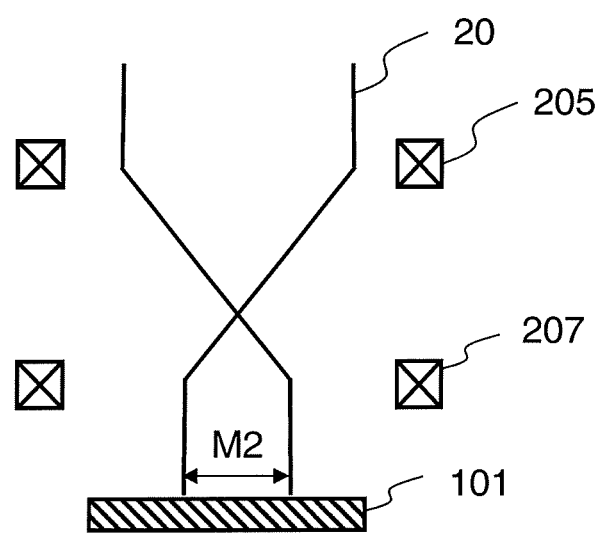

FIGS. 11A and 11B show examples of a state before and after magnification adjustment according to the first embodiment. The magnification of multiple beams on the substrate 101 is adjusted by the reducing lens 205 (electromagnetic lens) which refracts the multiple beams. As shown in FIG. 11A, in the inspection apparatus 100, it has been adjusted to be the magnification M1 on the substrate 101 regardless of the arrangement pitch Pd of the die on the substrate 101. According to the first embodiment, in order to correspond to the arrangement pitch Pd of a plurality of wafer dies 332, the magnification M1 is changed to the magnification M2 as shown in FIG. 11B. Specifically, the excitation current to the reducing lens 205 should be adjusted to be the magnification M2 which is obtained by multiplying the present magnification M1 by the magnification correction coefficient k. If deviation occurs in the focus control by the objective lens 207 since the final height position of the crossover of the multiple beams 20 changes due to change of the electron orbit along with change of the excitation current to the reducing lens 205, the focal height position should be changed by adjusting the height position of the XY stage 105, for example. Alternatively, it is also preferable to configure not to change the final height position of the crossover of the multiple beams 20 by disposing an electromagnetic lens (not shown) between the reducing lens 205 and the objective lens 207.

In the image acquisition step (S108), the image acquisition mechanism 150 (inspection image acquisition mechanism) acquires an inspection image of a plurality of wafer dies 332 arranged on the inspection substrate 101, using the multiple beams 20 whose magnification has been controlled such that the arrangement pitch Pd of a plurality of wafer dies 332 becomes a positive integer n (n being 2 or greater) multiple of the cycle (imaging region cycle: arrangement pitch) of the sub irradiation region 29 in the x direction (predetermined direction) of a plurality of sub irradiation regions 29 (imaging regions) to be individually imaged by each beam of the multiple beams 20.

The image acquisition mechanism 150 scans each set of N×N' sub irradiation regions 29 in a plurality of sub irradiation regions 29 (sub region; small region) which are obtained by dividing the stripe region 32 serving as the inspection region of the substrate 101 into them each having a width of Pb/M (M being an integer of 2 or greater) in the x direction and a length of Pb (predetermined size) in the y direction. Specifically, with respect to a plurality of sub irradiation regions 29, tracking is performed by collectively deflecting N×N' multiple beams 20 for the N×N' sub irradiation regions 29 on the substrate 101 composed of N sub irradiation regions 29 arranged in the x direction at the pitch Pb and N' sub irradiation regions 29 arranged in the y direction. As shown in FIG. 7, while the XY stage continuously moves in the −x direction the distance obtained by N/M·Pb, the N×N' sub irradiation regions 29 are scanned with the multiple beams 20 for which tracking deflection is being performed to follow the continuous movement of the XY stage 105.

First, under the control of the deflection control circuit 128, the main deflector 208 (first deflector) deflects, as the tracking region 33, the N×N' sub irradiation regions 29 arranged in the x direction at the pitch Pb in a plurality of sub irradiation regions 29 in the irradiation region 34 of the multiple beams 20. The main deflector 208 collectively deflects the multiple beams 20 to the reference position (e.g., center) of the tracking region 33. Then, the main deflector 208 performs tracking deflection of the multiple beams 20 to follow the continuous movement of the XY stage 105.

Under the control of the deflection control circuit 128, the sub deflector 209 (second deflector) collectively deflects the multiple beams 20 so that each of the multiple beams 20 may be, for example, at the position of the pixel 36 being the first in the x direction and the last in the y direction, in the corresponding sub irradiation region 29. Then, while the tracking deflection of the multiple beams 20 is performed to follow the continuous movement of the XY stage 105, the multiple beams 20 are collectively deflected to scan the N×N' sub irradiation regions 29 serving as the tracking region 33. The sub deflector 209 scans the sub irradiation region 29 in a manner such that, in each shot, scanning is shifted one pixel 36 by one pixel 36. By performing one shot, based on the multiple beams 20 formed by passing through a plurality of holes 22 in the shaping aperture array substrate 203, the secondary electrons 300, being a flux of secondary electrons, corresponding to a plurality of shots whose maximum number is the same as the number of a plurality of holes 22 are detected at a time. Until the multiple beams 20 have scanned all the measurement pixels 36 in the relational sub irradiation region 29, the main deflector 208 deflects (performs a tracking operation) the multiple beams 20 in order to follow the movement of the XY stage 105 so that the deflection position may not be displaced due to the movement of the XY stage 105.

Then, the multi-detector 222 detects the multiple secondary electrons 300 emitted from the substrate 101 due to irradiation of the multiple beams 20 onto the substrate 101. Detection data on a secondary electron from each measurement pixel 36 detected by the multi-detector 222 is output to the detection circuit 106 in order of measurement. In the detection circuit 106, the detection data in analog form is converted into digital data by an A-D converter (not shown), and stored in the stripe pattern memory 123. Then, when the detection data for one stripe region 32 (or one wafer die 332) has been accumulated, the accumulated data is transmitted as stripe pattern data (or chip pattern data) to the comparison circuit 108, with information data on each position from the position circuit 107.

According to the first embodiment, in the above scanning operation, since the arrangement pitch Pd of a plurality of wafer dies 332 arranged in the x direction has been adjusted to be an integer multiple (greater than twice) of the cycle (pitch) of the sub irradiation region 29 of each beam, each position of a plurality of wafer dies 332 arranged in the x direction is scanned (imaged) by the same beam.

In the comparison (die-to-die inspection) step (S110), the comparison circuit 108 (comparison unit) compares inspection images of a plurality of dies.

Figure 12:
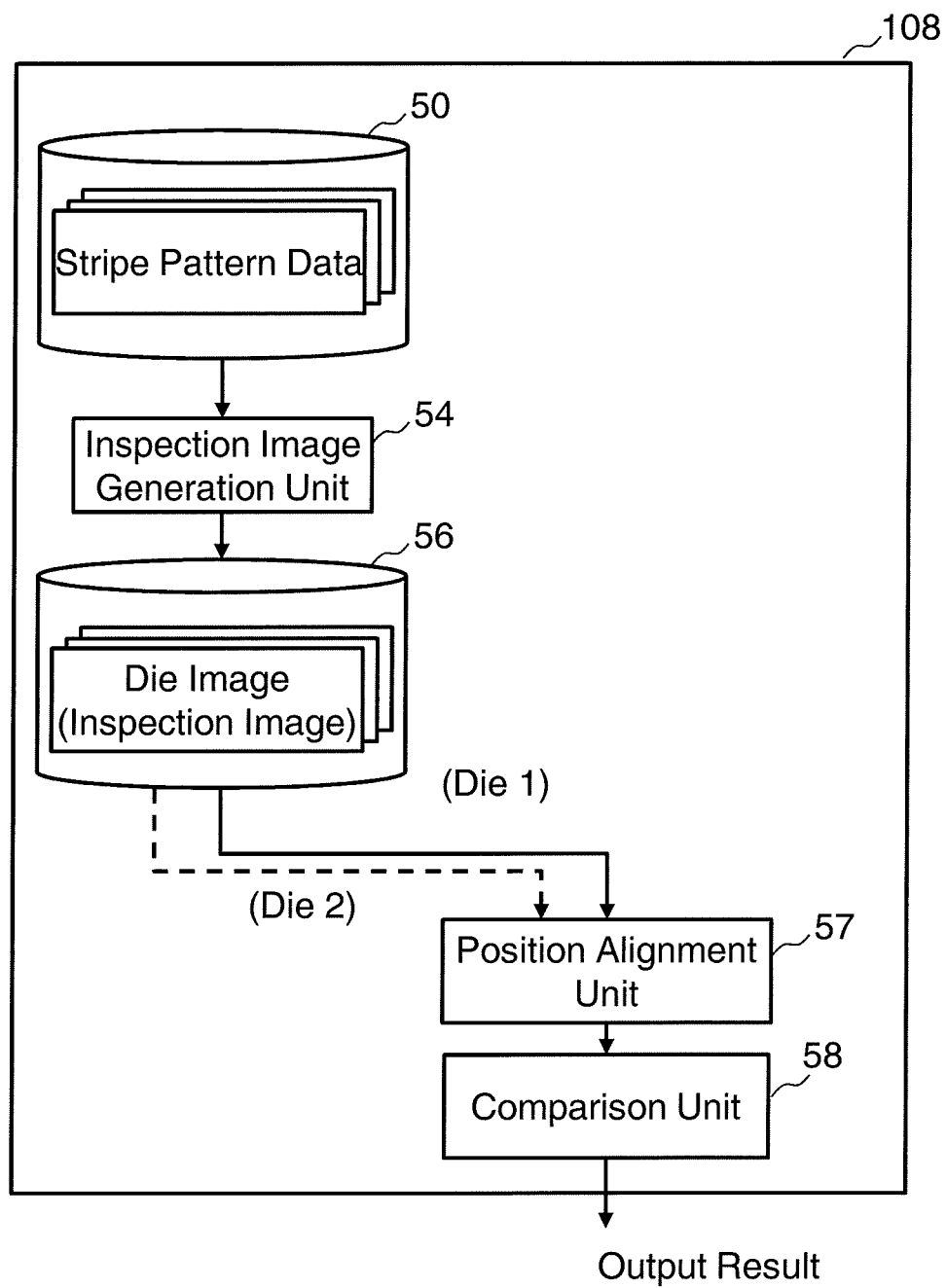
FIG. 12 shows an internal configuration of a comparison circuit according to the first embodiment.

FIG. 12 shows an internal configuration of a comparison circuit according to the first embodiment. In FIG. 12, storage devices 50 and 56, such as magnetic disk drives, an inspection image generation unit 54, a position alignment unit 57, and a comparison unit 58 are arranged in the comparison circuit 108. Each of the "units" such as the inspection image generation unit 54, the position alignment unit 57, and the comparison unit 58 includes processing circuitry. As the processing circuitry, for example, an electric circuit, computer, processor, circuit board, quantum circuit, or semiconductor device may be used. Each of the "units" may use common processing circuitry (same processing circuitry), or different processing circuitry (separate processing circuitry). Input data required in the inspection image generation unit 54, the position alignment unit 57, and the comparison unit 58, and calculated results are stored in a memory (not shown) each time.

The transmitted stripe pattern data (or chip pattern data) is temporarily stored in the storage device 50, with information data on each position from the position circuit 107.

Next, the inspection image generation unit 54 divides stripe pattern data (or chip pattern data) by the frame region (unit inspection region) of a predetermined size to generates a plurality of frame images (inspection image). The frame image is preferably set to be an image smaller than the wafer die 332. It is because when images of the entire wafer die 332 are compared, the data amount becomes too large. For example, it is set to be a rectangular (including square) region having the size in the y direction of the stripe region 32. However, the size of the frame region is not limited thereto.

Next, the position alignment unit 57 reads a frame image in one wafer die 332 (die 1) to be compared, and another frame image at the corresponding position in another wafer die 332 (die 2) to be compared, and performs position alignment of both the frame images, using a sub pixel unit smaller than the pixel 36. For example, the position alignment may be performed by a least-squares method.

The comparison unit 58 compares the frame image (die 1) and the frame image (die 2). The comparison unit 58 compares the frame images for each pixel 36, based on a predetermined criterion in order to determine whether there is a defect such as a shape defect. For example, if a grayscale level difference for each pixel 36 is larger than a determination threshold Th, it is determined that there is a defect. Alternatively, it is also preferable to inspect whether there is disconnection or short of a pattern by decreasing the inspection accuracy than the shape defect inspection. Alternatively, deviation of the periodicity of patterns formed may be inspected. Then, the comparison result is output, and specifically, output to the storage device 109, monitor 117, or memory 118, or alternatively, output from the printer 119.

As described above, according to the first embodiment, the same position in the dies to be compared can be imaged by a beam at the same arrangement position. Thereby, beam characteristics, such as a shape, distortion and/or brightness of each beam can be identical between images to be compared. Therefore, the inspection accuracy can be improved.

Second Embodiment

According to the first embodiment, by adjusting the magnification of a multiple beam image by an electromagnetic lens, the arrangement pitch Pd of a plurality of wafer dies 332 is controlled to be a positive integer n (n being 2 or greater) multiple of the arrangement pitch of the sub irradiation region 29 of each beam of the multiple beams 20. Magnification control of multiple beams is not limited to adjusting the magnification of a multiple beam image. According to a second embodiment, by performing another method for controlling the magnification of multiple beams, the arrangement pitch Pd of a plurality of wafer dies 332 is controlled to be a positive integer n (n being 2 or greater) multiple of the arrangement pitch of the sub irradiation region 29 of each beam of the multiple beams 20.

Figure 13:
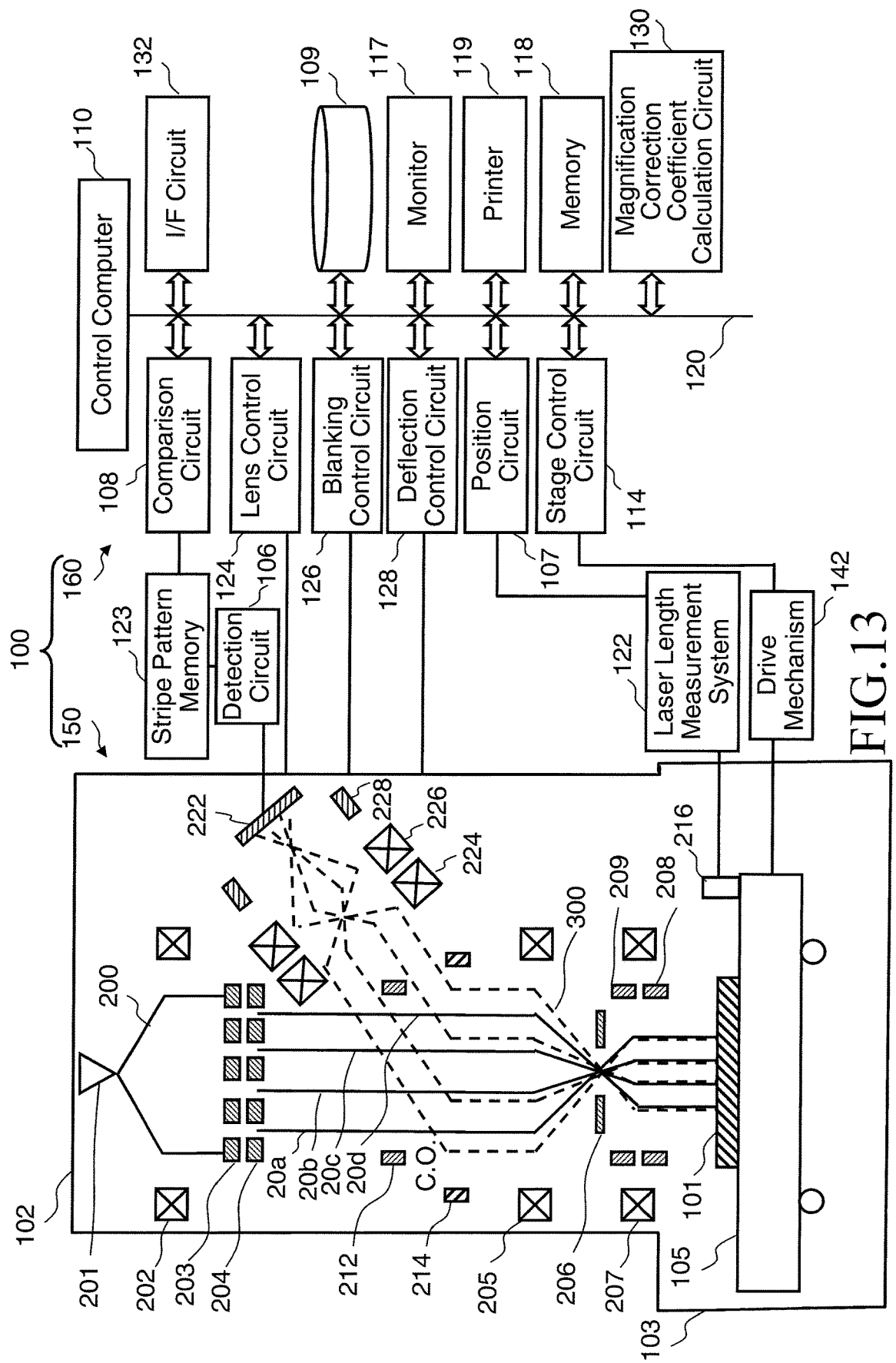
FIG. 13 is a block diagram showing a configuration of an inspection apparatus according to a second embodiment.

FIG. 13 is a block diagram showing a configuration of an inspection apparatus according to the second embodiment. The contents of FIG. 13 are the same as those of FIG. 1 except that a deflector array mechanism 204 is disposed between the shaping aperture array substrate 203 and the common blanking deflector 212. In other words, the image acquisition mechanism 150 further includes the deflector array mechanism 204. The flowchart showing main steps of an inspection method according to the second embodiment is the same as that of FIG. 10. The contents of the second embodiment are the same as those of the first embodiment except for what is specifically described below. In the second embodiment, the irradiation position of each beam on the substrate 101 is adjusted by the deflector array mechanism 204 instead of adjusting the magnification by the reducing lens 205.

Figure 14:
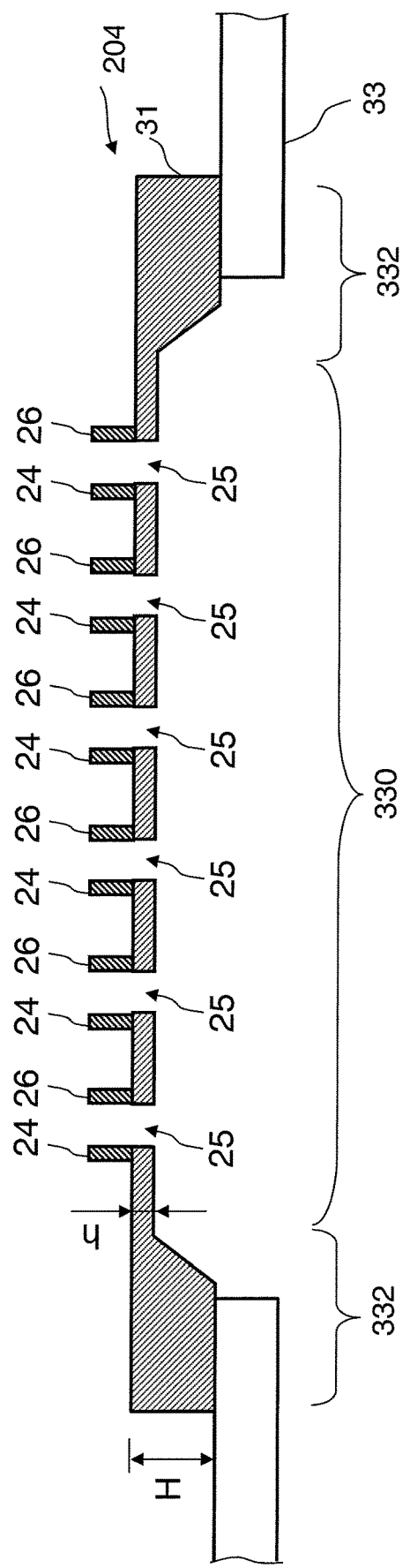
FIG. 14 is a sectional view showing a structure of a deflector array mechanism according to the second embodiment.

FIG. 14 is a sectional view showing a structure of a deflector array mechanism according to the second embodiment. With regard to the structure of the deflector array mechanism 204, as shown in FIG. 14, a semiconductor substrate 31 made of silicon, etc. is placed on a support table 33. The central part of the substrate 31 is shaved from the back side, and made into a membrane region 330 (first region) having a thin film thickness h. The periphery surrounding the membrane region 330 is an outer peripheral region 332 (second region) having a thick film thickness H. The upper surface of the membrane region 330 and the upper surface of the outer peripheral region 332 are formed to be flush or substantially flush in height with each other. At the back side of the outer peripheral region 332, the substrate 31 is supported on the support table 33. The central part of the support table 33 is open, and the membrane region 330 is located at this opening region.

In the membrane region 330, there are formed passage holes 25 (openings) each for each of the multiple beams individually having passed through the holes 22 of the shaping aperture array substrate 203 shown in FIG. 2. In other words, in the membrane region 330 of the substrate 31, there are formed a plurality of passage holes 25 in an array through each of which a corresponding beam of electron multiple beams passes. Around each passage hole 25, there are disposed at least two electrodes (or "at least two poles") 24 and 26 being opposite to each other across a corresponding one of a plurality of passage holes 25. The electrodes 24 and 26 should be arranged such that the cycle (pitch) of the sub irradiation region 29 of each beam can be adjusted with respect to a beam passing through between the electrodes 24 and 26 by an electric potential difference between the two electrodes 24 and 26. For example, when adjusting the cycle of the sub irradiation regions 29 arranged in the x direction, since it is necessary to deflect beams in the x direction or −x direction, the electrodes 24 and 26 should be arranged facing each other in the x direction. In the case of performing adjustment also in the y direction, four electrodes added by two electrodes arranged facing each other in the y direction are needed. The deflector composed of the electrodes 24 and 26 for each beam of the deflector array mechanism 204 is controlled by the deflection control circuit 128. For example, the deflection amount of a beam can be controlled by applying a ground potential to the electrode 26 and controlling an electric potential to the electrode 24.

The contents of each of the die pitch acquisition step (S102) and the magnification correction coefficient calculation step (S104) are the same as those in the first embodiment.

In the magnification correction control step (S106), the deflection control circuit 128 (another example of the magnification control circuit) controls the irradiation position of each beam of the multiple beams 20 on the substrate 101 by controlling the deflector array mechanism 204 such that, in the case of imaging the inspection substrate 101 with the multiple beams 20 while continuously moving the XY stage 105, the arrangement pitch Pd of a plurality of wafer dies 332 becomes a positive integer n (n being 2 or greater) multiple of the cycle (imaging region cycle: arrangement pitch) of the sub irradiation region 29 in the x direction (predetermined direction) of a plurality of sub irradiation regions 29 (imaging regions) to be individually imaged by a beam at each arrangement position of the multiple beams 20.

FIGS. 15A and 15B illustrate a method of correcting a beam position on the substrate according to the second embodiment. As shown in FIG. 15A, using beams 20a to 20e of the multiple beams 20 arranged at the reference arrangement pitch Pb, for making the arrangement pitch Pb of a plurality of wafer dies 332 be a positive integer n (n being 2 or greater) multiple of the cycle of the sub irradiation region 29 of each beam of the multiple beams 20, it is necessary to change the pitch between beams of the multiple beams 20 from the reference arrangement pitch Pb to the arrangement pitch kPb as shown in FIG. 15B. Thereby, it is possible to obtain the same effect as changing the magnification M1 of the multiple beams 20 to the magnification M2 which is k times the magnification M1 (k being a magnification correction coefficient). For the purpose, the deflection amount needs to be individually changed for each beam to be deflected. Then, the deflector array mechanism 204 (individual deflector array) deflects each of the multiple beams individually to the position corresponding to the magnification M2. In this way, according to the second embodiment, magnification control of the multiple beams 20 is performed. In the example of FIG. 15B, on the basis of the center beam 20c of the multiple beams 20, the beams 20d and 20e located in the x direction of the center beam 20c are deflected to extend in the x direction, and the beams 20a and 20b located in the −x direction of the center beam 20c are deflected to extend in the −x direction. However, it is not limited thereto. It is also preferable that, on the basis of the beam 20a at the left end of the multiple beams 20, the beams 20b, 20c, 20d, and 20e located in the x direction of the beam 20a are deflected to individually extend in the x direction. In either case, the deflection amount varies for each beam. Using the calculated magnification correction coefficient k, the deflection control circuit 128 individually calculates the irradiation position of each beam, and an individual deflection amount for changing to the calculated irradiation position. Then, the deflection control circuit 128 applies a voltage based on which the above deflection amount can be obtained, between the electrodes 24 and 26 of the deflector for each beam in the deflector array mechanism 204.

By changing the pitch between beams of the multiple beams from the reference arrangement pitch Pb to the arrangement pitch kPb, the relation shown in the relational expression (1) can be satisfied. Thereby, the cycle of the sub irradiation region 29 of each beam can be adjusted.

The contents of each step after the image acquisition step (S108) are the same as those of the first embodiment.

As described above, according to the second embodiment, the same position in the dies to be compared can be imaged by a beam at the same arrangement position as well as the first embodiment. Thereby, beam characteristics, such as a shape, distortion and/or brightness of each beam can be identical between images to be compared. Furthermore, according to the second embodiment, since the magnification of an image is not adjusted, each beam size on the substrate 101 can be maintained to be small. Therefore, the resolution before magnification control can be maintained. The inspection accuracy can be further improved than that in the first embodiment.

In the above description, each " . . . circuit" includes processing circuitry. As the processing circuitry, for example, an electric circuit, computer, processor, circuit board, quantum circuit, semiconductor device, or the like can be used. Each " . . . circuit" may use common processing circuitry (same processing circuitry), or different processing circuitry (separate processing circuitry). A program for causing a computer to implement processing by the processor and the like may be stored in a recording medium, such as a magnetic disk drive, magnetic tape drive, FD, ROM (Read Only Memory), etc.

Embodiments have been explained referring to specific examples described above. However, the present invention is not limited to these specific examples. Although the above examples describe the case of continuously moving the XY stage 105 at a constant speed, it is not limited thereto. Further, although the above examples describe the case of performing correction of the magnification of the multiple beams 20 in order to increase it, it goes without saying that correction may be performed in order to decrease it.

With respect to the arrangement pitch of the multiple beams 20, the pitch in the x direction and that in the y direction may be different from each other. For example, it is acceptable that the arrangement pitch in the x direction is an even pitch Pb and that in the y direction is an even pitch Pb'.

While the apparatus configuration, control method, and the like not directly necessary for explaining the present invention are not described, some or all of them can be selectively used on a case-by-case basis when needed.

In addition, any other multiple charged particle beam inspection apparatus and multiple charged particle inspection method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A multiple charged particle beam inspection apparatus comprising:
   a stage configured to be movable and place thereon an inspection substrate where a plurality of dies on each of which a same pattern has been formed are arranged in a predetermined direction;
   a die pitch acquisition circuit configured to acquire an arrangement pitch of the plurality of dies;
   a magnification control circuit configured to control, in a case of imaging the inspection substrate by using multiple charged particle beams while continuously moving the stage, magnification of the multiple charged particle beams to be a controlled magnification such that the arrangement pitch of the plurality of dies becomes a natural number (2 or greater) multiple of an imaging region cycle in the predetermined direction of a plurality of imaging regions to be individually imaged by each beam at each arrangement position of the multiple charged particle beams;
   an inspection image acquisition mechanism configured to acquire inspection images of the plurality of dies arranged on the inspection substrate, using the multiple charged particle beams whose magnification has been controlled to be the controlled magnification; and
   a comparison circuit configured to compare the inspection images of the plurality of dies.

2. The apparatus according to claim 1, wherein a magnification correction coefficient k for acquiring the controlled magnification is defined by an equation of k=Pd·M/(n·N·Pb) using an arrangement pitch Pd of the plurality of dies, an arrangement number N in the predetermined direction of the multiple charged particle beams, a reference arrangement pitch Pb in the predetermined direction of the multiple charged particle beams on the inspection substrate, a division number M (M being an integer of 2 or greater) used for dividing the reference arrangement pitch Pb, and a natural number n.

3. The apparatus according to claim 1, wherein the inspection image acquisition mechanism includes an electromagnetic lens for refracting the multiple charged particle beams in order to adjust to the controlled magnification.

4. The apparatus according to claim 1, wherein the inspection image acquisition mechanism includes an individual deflector array for individually deflecting the each beam of the multiple charged particle beams to a position corresponding to the controlled magnification.

5. The apparatus according to claim 1, wherein
the multiple charged particle beams are N×N' charged particle beams arranged two-dimensionally in the predetermined direction and in a direction orthogonal to the predetermined direction, and
a plurality of small regions each having a size in the direction orthogonal to the predetermined direction longer than a size in the predetermined direction are individually irradiated with corresponding charged particle beams of the multiple charged particle beams.

6. The apparatus according to claim 5, wherein
a value obtained by dividing a reference arrangement pitch Pb in the predetermined direction of the multiple charged particle beams on the inspection substrate by a number M (M being an integer of 2 or greater) is used as the size in the predetermined direction, and
a value of the reference arrangement pitch Pb is used as the size in the direction orthogonal to the predetermined direction.

7. The apparatus according to claim 2, further comprising:
a stage control circuit configured to control movement of the stage such that the stage moves by N/M·Pb by continuous movement while a plurality of small regions, each of which is surrounded by a size of a value obtained by dividing the reference arrangement pitch Pb in the predetermined direction by the division number M and a size of a value of the reference arrangement pitch Pb in a direction orthogonal to the predetermined direction, are irradiated with corresponding charged particle beams of the multiple charged particle beams.

8. A multiple charged particle beam inspection method comprising:
acquiring an arrangement pitch of a plurality of dies, on each of which a same pattern has been formed, arranged in a predetermined direction on an inspection substrate;
controlling, in a case of imaging the inspection substrate by using multiple charged particle beams while continuously moving a stage, magnification of the multiple charged particle beams to be a controlled magnification such that the arrangement pitch of the plurality of dies becomes a natural number (2 or greater) multiple of an imaging region cycle in the predetermined direction of a plurality of imaging regions to be individually imaged by each beam at each arrangement position of the multiple charged particle beams;
acquiring inspection images of the plurality of dies arranged on the inspection substrate, using the multiple charged particle beams whose magnification has been controlled to be the controlled magnification; and
comparing the inspection images of the plurality of dies to output a comparison result.

9. The method according to claim 8, wherein the controlling the magnification includes using a magnification correction coefficient k defined by an equation of k=Pd·M/(n·N·Pb) using an arrangement pitch Pd of the plurality of dies, an arrangement number N in the predetermined direction of the multiple charged particle beams, a reference arrangement pitch Pb in the predetermined direction of the multiple charged particle beams on the inspection substrate, a division number M (M being an integer of 2 or greater) used for dividing the reference arrangement pitch Pb, and a natural number n.

10. The method according to claim 9, further comprising:
controlling movement of the stage such that the stage moves by N/M·Pb by continuous movement while a plurality of small regions, each of which is surrounded by a size of a value obtained by dividing the reference arrangement pitch Pb in the predetermined direction by the division number M and a size of a value of the reference arrangement pitch Pb in a direction orthogonal to the predetermined direction, are irradiated with corresponding charged particle beams of the multiple charged particle beams.

* * * * *